United States Patent
Son et al.

(10) Patent No.: US 10,032,523 B2
(45) Date of Patent: Jul. 24, 2018

(54) MEMORY DEVICE INCLUDING EXTRA CAPACITY AND STACKED MEMORY DEVICE INCLUDING THE SAME

(71) Applicant: SAMSUNG ELECTRONICS CO., LTD., Suwon-si, Gyeonggi-Do (KR)

(72) Inventors: Jongpil Son, Seongnam-si (KR); Hosung Song, Seoul (KR); Wonchang Jung, Osan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/450,588

(22) Filed: Mar. 6, 2017

(65) Prior Publication Data

US 2017/0352433 A1 Dec. 7, 2017

(30) Foreign Application Priority Data

Jun. 7, 2016 (KR) .................. 10-2016-0070500

(51) Int. Cl.
*G11C 29/02* (2006.01)
*G11C 7/10* (2006.01)
*G11C 7/22* (2006.01)
*H01L 25/065* (2006.01)

(52) U.S. Cl.
CPC .............. *G11C 29/023* (2013.01); *G11C 7/10* (2013.01); *G11C 7/22* (2013.01); *H01L 25/0657* (2013.01); *H01L 2225/06541* (2013.01)

(58) Field of Classification Search
CPC .................................................. H01L 2924/00

USPC ......................................................... 711/114
See application file for complete search history.

(56) References Cited

U.S. PATENT DOCUMENTS

| | | | |
|---|---|---|---|
| 5,596,536 A * | 1/1997 | Koh ...................... | G11C 29/80 365/200 |
| 5,784,391 A | 7/1998 | Konigsburg | |
| 5,787,460 A * | 7/1998 | Yashiro ............... | G06F 11/1076 711/113 |
| 6,598,174 B1 * | 7/2003 | Parks .................... | G06F 11/008 711/162 |
| 7,184,352 B2 | 2/2007 | Klein et al. | |
| 7,386,771 B2 | 6/2008 | Shuma | |

(Continued)

OTHER PUBLICATIONS http://news.samsung.com/kr/vX7do, Samsung Electronics Co., Ltd., Jan. 19, 2016.

*Primary Examiner* — Min Huang
(74) *Attorney, Agent, or Firm* — F. Chau & Associates, LLC

(57) ABSTRACT

A memory device includes a memory cell array, a multiplexing circuit, and a control logic circuit. The memory cell array includes a first sub memory cell array, a second sub memory cell array, and a third sub memory cell array. The multiplexing circuit selects the first sub memory cell array, the second sub memory cell array, and the third sub memory cell array in a first mode of operation, and when the first sub memory cell array is defective in a second mode of operation, the multiplexing circuit selects the second sub memory cell array and the third sub memory cell array. The control logic circuit selects the first mode of operation or the second mode of operation. The control logic circuit controls the multiplexing circuit so that the first, second and third sub memory cell arrays are connected to input or output pads.

20 Claims, 15 Drawing Sheets

(56) References Cited

U.S. PATENT DOCUMENTS

| | | | |
|---|---|---|---|
| 7,404,136 B2 | 7/2008 | Ruckerbauer et al. | |
| 7,774,684 B2 | 8/2010 | Bains | |
| 8,468,419 B2 | 6/2013 | Dudeck et al. | |
| 2003/0218216 A1* | 11/2003 | Matsumoto | B82Y 10/00 257/365 |
| 2009/0039492 A1* | 2/2009 | Kang | G11C 5/02 257/686 |
| 2011/0041016 A1 | 2/2011 | O'Connell | |
| 2012/0072680 A1* | 3/2012 | Kimura | G06F 11/108 711/154 |
| 2013/0155794 A1* | 6/2013 | Wu | G11C 29/802 365/200 |
| 2014/0068319 A1* | 3/2014 | Daly | G11C 7/1006 714/6.2 |
| 2014/0317469 A1 | 10/2014 | Sohn et al. | |
| 2016/0099079 A1* | 4/2016 | Park | G11C 29/78 365/96 |
| 2017/0168931 A1* | 6/2017 | Kim | G06F 12/0246 |

\* cited by examiner

MEMORY DEVICE INCLUDING EXTRA CAPACITY AND STACKED MEMORY DEVICE INCLUDING THE SAME

CROSS-REFERENCE TO RELATED APPLICATION

This U.S. non-provisional patent application claims priority under 35 U.S.C. § 119 to Korean Patent Application No. 10-2016-0070500, filed on Jun. 7, 2016, in the Korean Intellectual Property Office, the disclosure of which is incorporated by reference herein in its entirety.

TECHNICAL FIELD

The inventive concept relates to a memory device, and more particularly, to a memory device including extra capacity.

DISCUSSION OF THE RELATED ART

A memory device is widely used in electronic devices such as mobile devices, computers, etc. The memory capacity of a memory device is increasing due to new manufacturing process technologies. A high capacity memory device can be used in an electronic device. In a high capacity memory device, a manufacturer of the memory device may provide extra storage capacity. For example, a memory manufacturer may produce a memory device of 8 Gb. However, the memory manufacturer may produce a memory device of 9 Gb by adding an extra storage capacity of 1 Gb to the 8 Gb memory device.

After producing a memory device loaded with extra storage capacity, a memory manufacturer may sell the memory device including the extra storage capacity, or may sell the memory device without the extra storage capacity. For example, after producing a memory device of 9 Gb, which is obtained by adding an extra 1 Gb of storage capacity to an 8 Gb memory device, the memory manufacturer may sell the memory device as a memory device in which a user can use all 9 Gb or just 8 Gb.

When a fine process technology is used to make a memory device, there may be a large number of failed memory cells. Accordingly, a new device manufactured for extra capacity may increase yield.

SUMMARY

According to an exemplary embodiment of the inventive concept, a memory device includes a memory cell array including a first sub memory cell array, a second sub memory cell array, and a third sub memory cell array, a multiplexing circuit that selects the first sub memory cell array, the second sub memory cell array, and the third sub memory cell array in a first mode of operation, and when the first sub memory cell array is defective in a second mode of operation, selects the second sub memory cell array and the third sub memory cell array, and a control logic circuit that selects the first mode of operation or the second mode of operation. The control logic circuit controls the multiplexing circuit so that the first, second and third sub memory cell arrays are connected to input or output pads.

According to an exemplary embodiment of the inventive concept, a stacked memory device includes a plurality of memory dies, and a buffer die that controls the plurality of memory dies. At least one of the memory dies includes a first through silicon via (TSV) area including TSVs connected to the buffer die, a memory cell array including a plurality of first sub memory cell arrays and a second sub memory cell array, a multiplexing circuit that connects the plurality of first sub memory cell arrays and the second sub memory cell array to the first TSV area in a first mode, and in a second mode, the multiplexing circuit connects the plurality of first sub memory cell arrays and the second sub memory cell array, except for failed cell arrays among the plurality of first sub memory cell arrays and the second sub memory cell array, to the first TSV area, and a control logic circuit that selects the first mode or the second mode, controls the multiplexing circuit so that the plurality of first sub memory cell arrays is connected to first input or output pads, and controls the multiplexing circuit so that the second sub memory cell array is connected to the first input or output pads.

According to an exemplary embodiment of the inventive concept, a memory device includes a memory cell array including a first sub memory cell array, a second sub memory cell array and a third sub memory cell array, a multiplexing circuit that selects each of the first, second and third sub memory cell arrays in a first operating mode, and in a second operating mode, the multiplexing circuit selects non-defective sub memory cell arrays, from among the first, second and third sub memory cell arrays, when the first, second or third memory sub cell array is defective, and when in the second operating mode and there are no defective sub memory cell arrays, from among the first, second and third sub memory cell arrays, the multiplexing circuit selects the first and second sub memory cell arrays or the second and third sub memory cell arrays, and a control logic circuit that selects the first operating mode or the second operating mode. The control logic circuit controls the multiplexing circuit so that the first, second and third sub memory cell arrays are connected to input or output pads.

BRIEF DESCRIPTION OF THE DRAWINGS

The above and other features of the inventive concept will become more apparent by describing in detail exemplary embodiments thereof in conjunction with the accompanying drawings, in which.

DETAILED DESCRIPTION OF THE EMBODIMENTS

Exemplary embodiments of the inventive concept will be described more fully hereinafter with reference to accompanying drawings.

Figure 1:
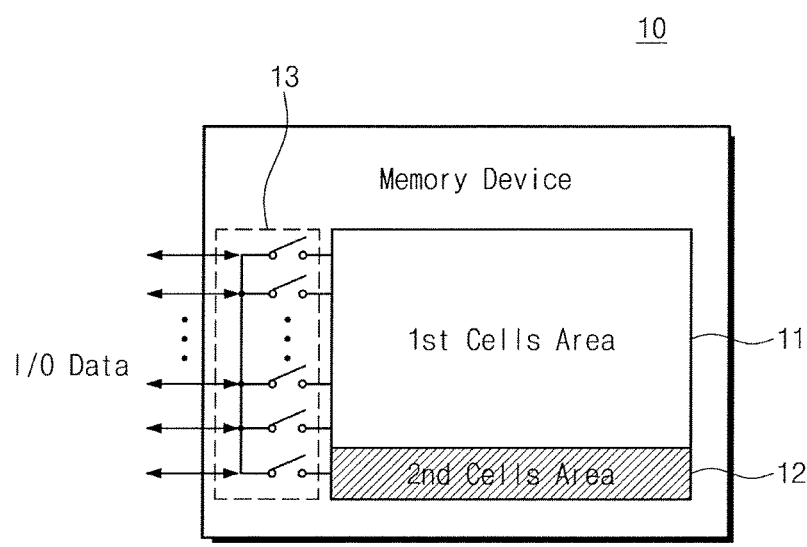
FIG. 1 is a block diagram illustrating a memory device according to an exemplary embodiment of the inventive concept.

FIG. 1 is a block diagram illustrating a memory device according to an exemplary embodiment of the inventive concept. Referring to FIG. 1, a memory device 10 may include a first cells area 11, a second cells area 12, and switches 13. The memory device 10 may perform an input/output of data in the first cells area 11 or the second cells area 12 according to an operating mode.

For example, in a first mode, the memory device 10 may provide access to both the first cells area 11 and the second cells area 12 to an external device (e.g., a memory controller). An input/output of data may be performed in both the first cells area 11 and the second cells area 12. In the first mode, all of the switches 13 may be turned on.

For example, in a second mode, the memory device 10 may provide access to only the first cells area 11 to the external device (e.g., a memory controller). An input/output of data may be performed in the first cells area 11. The second cells area 12 may be used to repair failed cells generated in the first cells area 11. In this case, among the switches 13, a switch connected to the failed cells may be turned off and a switch connected to the second cells area 12 may be turned on. The failed cells may be repaired in the second cells area 12. However, a method of repairing failed cells is not limited thereto. In other words, in the second mode of operation, when a cell included in the first cells area 11 fails, the loss of the storage capacity associated with the failed cell is compensated by using another cell in the second cells area 12.

Figure 2:
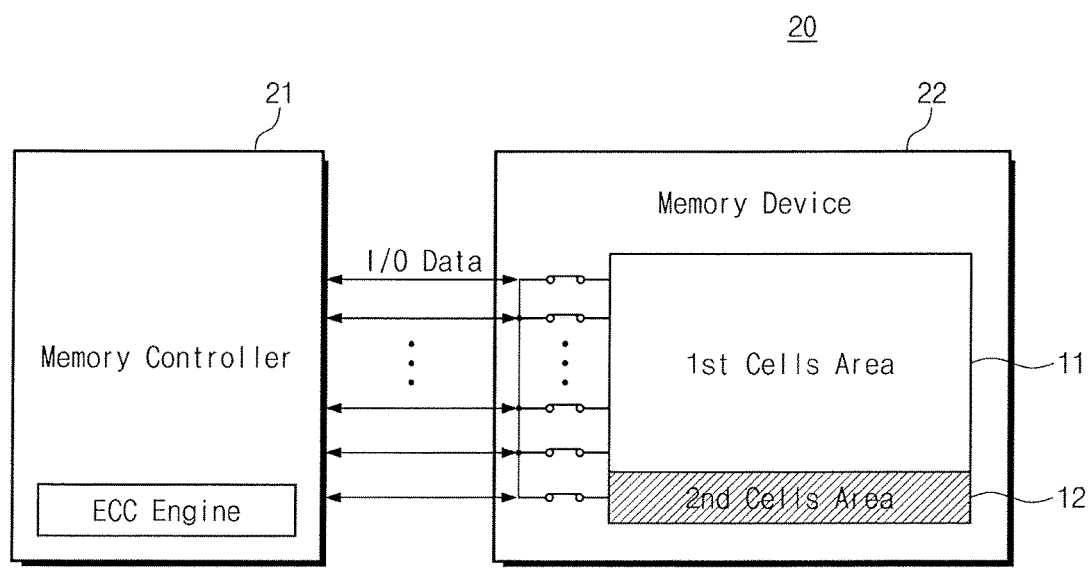
FIG. 2 is a block diagram illustrating a memory device that operates in a first mode, according to an exemplary embodiment of the inventive concept.

FIG. 2 is a block diagram illustrating a memory device that operates in a first mode, according to an exemplary embodiment of the inventive concept. Referring to FIG. 2, a memory system 20 may include a memory controller 21 and a memory device 22. The memory controller 21 can control the memory device 22. The memory controller 21 may provide commands, addresses, data to be stored, etc., to the memory device 22. The memory device 22 may provide stored data to the memory controller 21, according to the control of the memory controller 21.

The memory controller 21 may include an error correction code (ECC) engine. When the memory controller 21 transmits/receives data to/from the memory device 22, the ECC engine may perform an ECC operation. To perform an ECC operation, the memory device 22 may use the first cells area 11 and the second cells area 12. When the memory controller 21 writes data in the memory device 22, the memory controller 21 may store an ECC operation result (e.g., parity bits) with respect to the write data in the second cells area 12. When the memory controller 21 reads data from the memory device 22, the ECC engine may perform an ECC operation with respect to the read data using the ECC operation result stored in the second cells area 12. Besides information about the ECC, metadata with respect to data stored in the first cells area may be stored in the second cells area 12.

Figure 3:
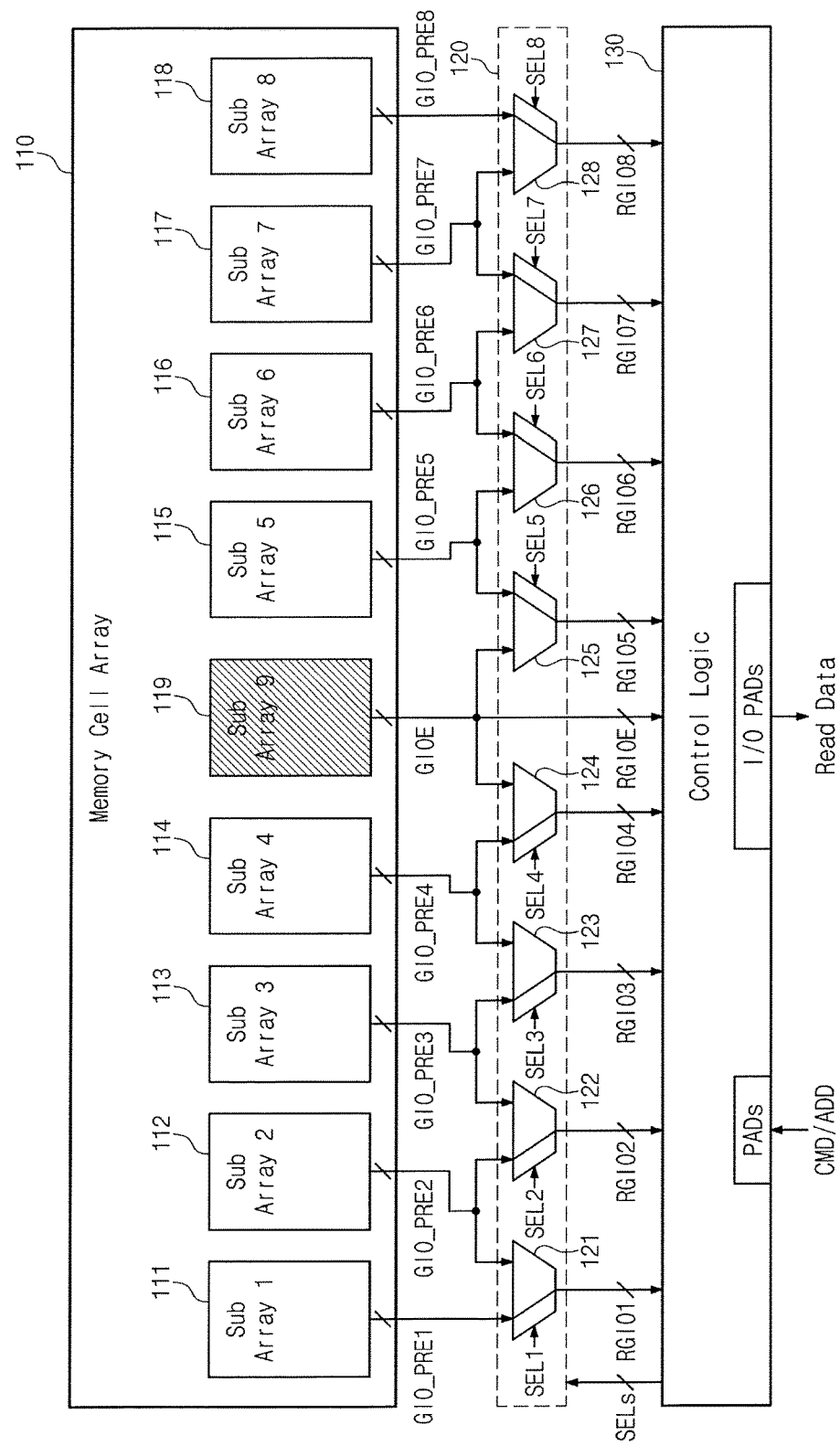
FIGS. 3 and 4 are block diagrams illustrating a memory device that operates in a first mode, according to an exemplary embodiment of the inventive concept.
Figure 4:
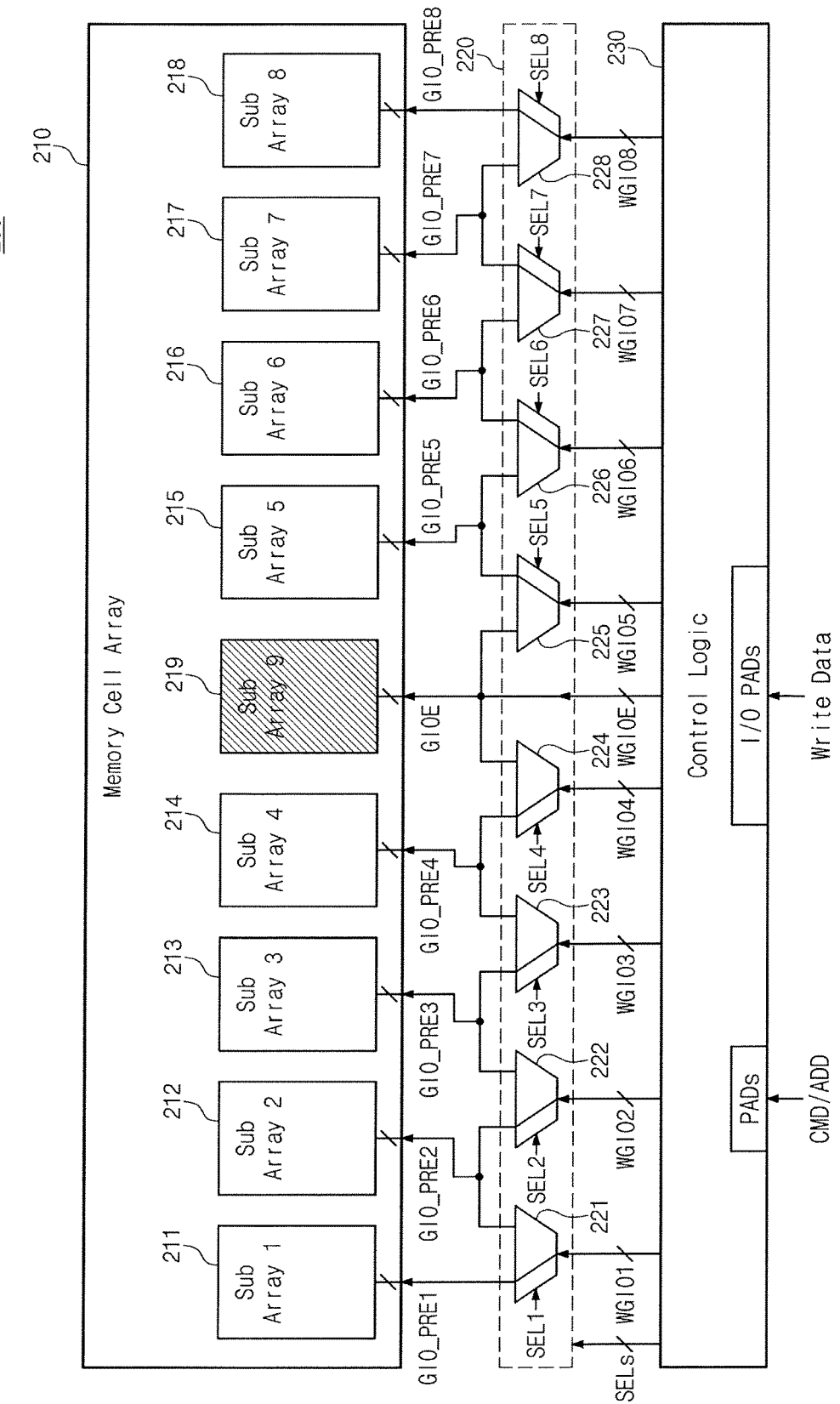

FIGS. 3 and 4 are block diagrams illustrating a memory device that operates in a first mode, according to an exemplary embodiment of the inventive concept. FIG. 3 relates to a case where a memory device 100 performs a read operation in a first mode. FIG. 4 relates to a case where a memory device 200 performs a write operation in the first mode. The first mode relates to a case where an extra capacity, inside the memory device, is provided to another circuit.

Referring to FIG. 3, the memory device 100 may include a memory cell array 110, a multiplexing circuit 120, and control logic circuit 130. The memory device 100 may include a plurality of memory cell arrays and a plurality of multiplexing circuits. The number of memory cell arrays may be determined by a specification (e.g., the storage capacity of the memory device 100). The number of multiplexing circuits may be the same as the number of memory cell arrays.

The memory cell array 110 may include a plurality of sub memory cell arrays, for example, the memory cell arrays (111 to 119). When the memory device 100 operates in the first mode, the total capacity of the memory device 100 may be a value obtained by adding the capacity of each of the sub memory cell arrays (111 to 119). An extra capacity of the memory device 100 may be capacity of the ninth sub memory cell array 119. When the memory device 100 includes a memory cell array, the total capacity of the memory device 100 may be a value obtained by adding the capacity of each of the sub memory cell arrays (111 to 119). When the memory device 100 includes a plurality of memory cell arrays, the total capacity of the memory device 100 may be a value obtained by adding the capacity of each of the sub memory cell array included in each of the memory cell arrays. When the memory device 100 includes a plurality of memory cell arrays, the extra capacity of the memory device 100 may be a value obtained by multiplying the capacity of the ninth memory cell array 119 by the number of memory cell arrays included in the memory device 100.

When the memory device 100 operates in the second mode, the total capacity of the memory device 100 may be a value obtained by adding the capacity of each of the sub memory cell arrays (111 to 118). When the memory device 100 includes a plurality of memory cell arrays, the total capacity of the memory device 100 may be a value obtained by adding the capacity of each of the sub memory cell arrays included in each of the memory cell arrays. In this case, a failed sub memory cell array among the sub memory cell arrays (111 to 118) may be repaired using the ninth sub memory cell array 119 used as a repair area. Here, the failed sub memory cell array may include failed memory cells. Referring to FIG. 3, the memory cell array 110 may include a ninth sub memory cell array 119. The memory cell array 110 may include a plurality of ninth sub memory cell arrays 119.

In each sub memory cell array of the memory cell array 110, in a read operation, stored data may be transmitted to another circuit through input/output (I/O) pads. For example, a first input/output pad may be allocated to the first sub memory cell array 111. A second, a third, a fourth, a fifth, a sixth, a seventh and an eighth I/O pad, respectively, may be allocated to the remaining sub memory cell arrays (112 to 118). A ninth I/O pad may be allocated to the ninth sub memory cell array 119. The ninth sub memory cell array 119 may be a sub memory cell that is the same as or similar to any of the sub memory cell arrays (111 to 118).

When a read operation is performed with respect to the memory device 100, read data outputted from the first sub memory cell array 111 may be transmitted to the multiplexing circuit 120 through a first global pre-line set (GIO_PRE1). The read data outputted from the first sub memory cell array 111 may include a plurality of bits. The number of bits may be determined by the number of bits which the memory device 100 has to output in response to a read command. For example, the read data outputted from the first sub memory cell array 111 may include 8 bits. In this case, the first global pre-line set (GIO_PRE1) may include 8 lines. Each of the remaining sub memory cell arrays (112 to 119) may perform the same function as the first sub memory array 111. When a read operation is performed with respect to the memory device 100, a process in which read data is output from the first sub memory cell array 111 to another circuit will be described later in detail. Read data outputted from each of the sub memory cell arrays (111 to 119) may be transmitted to the multiplexing circuit 120.

The multiplexing circuit 120 may include read multiplexer arrays (121 to 128). The multiplexing circuit 120 may select global pre-line sets (GIO_PRE1 to GIO_PRE8, and GIOE) according to a control of select signals (SELs). The select signals (SELs) may include select signals (SEL1 to SEL8). The multiplexing circuit 120 may be a circuit that performs the function of the switches 13 (refer to FIG. 1). Referring to FIG. 3, the select signals (SEL1 to SEL8) may be generated by the control logic circuit 130.

The first read multiplexer array 121 may select either the first global pre-line set (GIO_PRE1) or the second global pre-line set (GIO_PRE2) in response to the first select signal SEL1. The first read multiplexer array 121 may send bits transmitted through a selected line set to the control logic circuit 130 through a first read global line set (RGIO1). The first read multiplexer array 121 may include as many read multiplexers as the number of lines which each of the first global pre-line set (GIO_PRE1) and the second global pre-line set (GIO_PRE2) includes. When a read operation is performed with respect to the memory device 100, read data may be output from the first sub memory cell array 111. The read data may include 8 bits. The first global pre-line set (GIO_PRE1) may include 8 lines. The first read multiplexer array 121 may include 8 read multiplexers.

Referring to FIG. 3, since each of the second, third, sixth, seventh and eighth read multiplexer arrays 122, 123, 126, 127 and 128 receives a different input signal from the first read multiplexer array 121, but performs the same function as the first read multiplexer array 121, a description thereof will be omitted for brevity.

The fourth read multiplexer array 124 may select the fourth global pre-line set (GIO_PRE4) or the ninth global pre-line set (GIOE) in response to the fourth select signal SEL4. The fourth read multiplexer array 124 may output bits transmitted through the selected pre-line set to a fourth read global line set RGIO4. Referring to FIG. 3, input signals of the fourth read multiplexer array 124 may be different from the input signals of the first read multiplexer array 121. The circuitry of the fourth read multiplexer array 124 may be the same as the circuitry of the first read multiplexer array 121. Since the fifth read multiplexer array 125 receives a different input signal from the fourth read multiplexer array 124 but performs the same function as the fourth read multiplexer array 124, a description thereof will be omitted for brevity.

FIG. 3 relates to a case where the memory device 100 performs a read operation in the first mode. The memory device 100 may output data stored in the ninth sub memory cell array 119 to another circuit through the ninth I/O pad in response to a read command. In addition, the multiplexing circuit 120 may directly connect the ninth global pre-line set (GIOE) to a ninth read global line set RGIOE.

The control logic circuit 130 may control the memory cell array 110 and the multiplexing circuit 120 in response to commands and addresses (CMD/ADD) that are inputted from another circuit. The control circuit 130 may receive read data from the multiplexing circuit 120 through read global line sets (RGIO1 to RGIO8, and RGIOE). The control logic circuit 130 may transmit the received read data to another circuit through the I/O pads.

FIG. 4 relates to a case where a memory device 200 performs a write operation in a first mode. FIG. 4 will be described with reference to FIG. 3. Referring to FIG. 4, the memory device 200 may include a memory cell array 210, a multiplexing circuit 220, and a control logic circuit 230. Although not illustrated, the memory device 200 may include a plurality of memory cell arrays and a plurality of multiplexing circuits. The number of memory cell arrays may be determined by a specification (e.g., the storage capacity of the memory device 200). The number of multiplexing circuits may be the same as the number of memory cell arrays.

The memory cell array 210 may be the same as the memory cell array 110 (refer to FIG. 3). In addition, a write operation may be performed in the memory cell array 210. In the write operation, each sub memory cell array of the memory cell array 210 may receive write data through the I/O pads. For example, a first I/O pad may be allocated to a first sub memory cell array 211. A second, a third, a fourth, a fifth, a sixth, a seventh and an eighth I/O pad, respectively, may be allocated to remaining sub memory cell arrays (212 to 218) respectively. A ninth I/O pad may be allocated to a ninth sub memory cell array 219.

When a write operation is performed on the memory device 200, write data may be sent from the control logic circuit 230 to the multiplexing circuit 220 through write global line sets (WGIO1 to WGIO8, and WGIOE). The multiplexing circuit 220 may include write multiplexer arrays (221 to 228). The multiplexing circuit 220 may include both the read multiplexer arrays (121 to 128, refer to FIG. 3) and the write multiplexer arrays (221 to 228). The multiplexing circuit 220 may be a circuit that performs the function of the switches 13 (refer to FIG. 1). The multiplexing circuit 220 may select the write global line sets (WGIO1 to WGIO8, WGIOE) according to the control of select signals (SELs). The select signals (SELs) may include select signals (SEL1 to SEL8). Referring to FIG. 4, the select signals (SEL1 to SEL8) may be generated by the control logic circuit 230.

The first read multiplexer array 221 may select either the first global pre-line set (GIO_PRE1) or the second global pre-line set (GIO_PRE2) in response to the first select signal SEL1 The first read multiplexer array 221 may output bits transmitted through the first global line set WGIO1 to the selected pre-line set. The first read multiplexer array 221 may include as many write multiplexers as the number of lines which each of the first global pre-line set (GIO_PRE1) and the second global pre-line set (GIO_PRE2) includes.

Referring to FIG. 4, since each of the second, third, sixth, seventh and eighth write multiplexer arrays 222, 223, 226, 227 and 228 receives a different input signal from the first read multiplexer array 121 but performs the same function as the first write multiplexer array 221, a description thereof will be omitted for brevity.

The fourth write multiplexer array 224 may select the fourth global pre-line set (GIO_PRE4) or the ninth global pre-line set (GIOE) in response to the fourth select signal SEL4. The fourth write multiplexer array 124 may output bits transmitted through the fourth write global line set WGIO4 to the selected pre-line set. Referring to FIG. 4, the input signals of the fourth read multiplexer array 224 may be different from the input signals of the first write multiplexer array 221. The circuitry of the fourth write multiplexer array 224 may be the same as the circuitry of the first write multiplexer array 221. Since the fifth write multiplexer array 225 receives a different input signal from the fourth write multiplexer array 224 but performs the same function as the fourth write multiplexer array 224, a description thereof will be omitted for brevity.

FIG. 4 relates to a case where a memory device 200 performs a write operation in a first mode. The memory device 200 may store write data inputted through the ninth I/O pad in the ninth sub memory cell array 219 in response to a write command. For example, the multiplexing circuit 220 may directly connect the ninth write global line set WGIOE to the ninth global pre-line set GIOE. Each of the sub memory cell arrays (211 to 219) may receive write data from the multiplexing circuit 220 through each of global pre-line sets (GIO_PRE1 to GIO_PRE8, and GIOE). The received write data may be stored in internal memory cells of each of the sub memory cell arrays (211 to 219).

Referring to FIG. 3, the read global line sets (RGIO1 to RGIO8, and RGIOE) are illustrated. Referring to FIG. 4, the write global line sets (WGIO1 to WGIO8, and WGIOE) are illustrated. The read global line sets (RGIO1 to RGIO8, and RGIOE) and the write global line sets (WGIO1 to WGIO8, and WGIOE) may be physically or logically separated from one another. In an exemplary embodiment of the inventive concept, the read global line sets (RGIO1 to RGIO8, and RGIOE) and the write global line sets (WGIO1 to WGIO8, and WGIOE) may be only logically separated, not physically separated.

Figure 5:
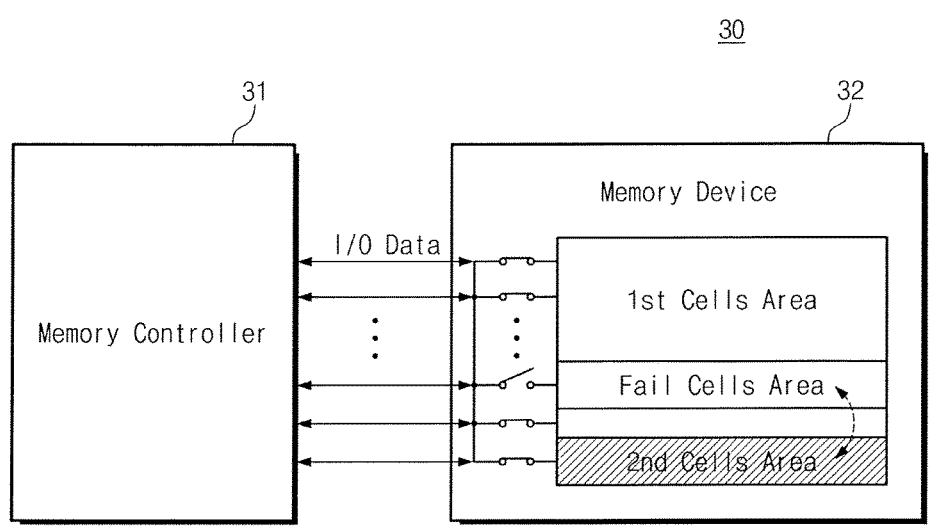
FIG. 5 is a block diagram illustrating a memory device that operates in a second mode, according to an exemplary embodiment of the inventive concept.

FIG. 5 is a block diagram illustrating a memory device that operates in a second mode, according to an exemplary embodiment of the inventive concept. Referring to FIG. 5, a memory system 30 may include a memory controller 31 and a memory device 32. The memory device 32 may be the same as the memory device 22 of FIG. 2. The memory controller 31 may not include an ECC engine. The memory system 30 may use the memory device 32 regardless of the ECC engine. When the memory device 32, according to an exemplary embodiment the inventive concept, is applied to the memory system 30, the memory device 32 may replace failed cells in a first cells area with extra cells (e.g., cells in a second cells area). Here, the failed cells may include defective cells and weak cells. Defective cells may mean cells which have failed in an aspect of hardware and weak cells may mean cells which have failed in an aspect of software. For example, the cells which have failed in aspect of hardware may be cells that have physically failed and the cells which have failed in aspect of software may be cells which have not physically failed but, from a test result, are treated as a failure.

The memory device 22 of FIG. 2 may provide extra capacity (e.g., the second cells area 12) to the memory controller 21 of FIG. 2. Referring to FIG. 5, the memory device 32 may not provide extra capacity (e.g., the second cells area) to the memory controller 31, but the memory device 32 may replace failed memory cells from the first cells area with extra capacity from the memory cells of the second cells area.

Figure 6:
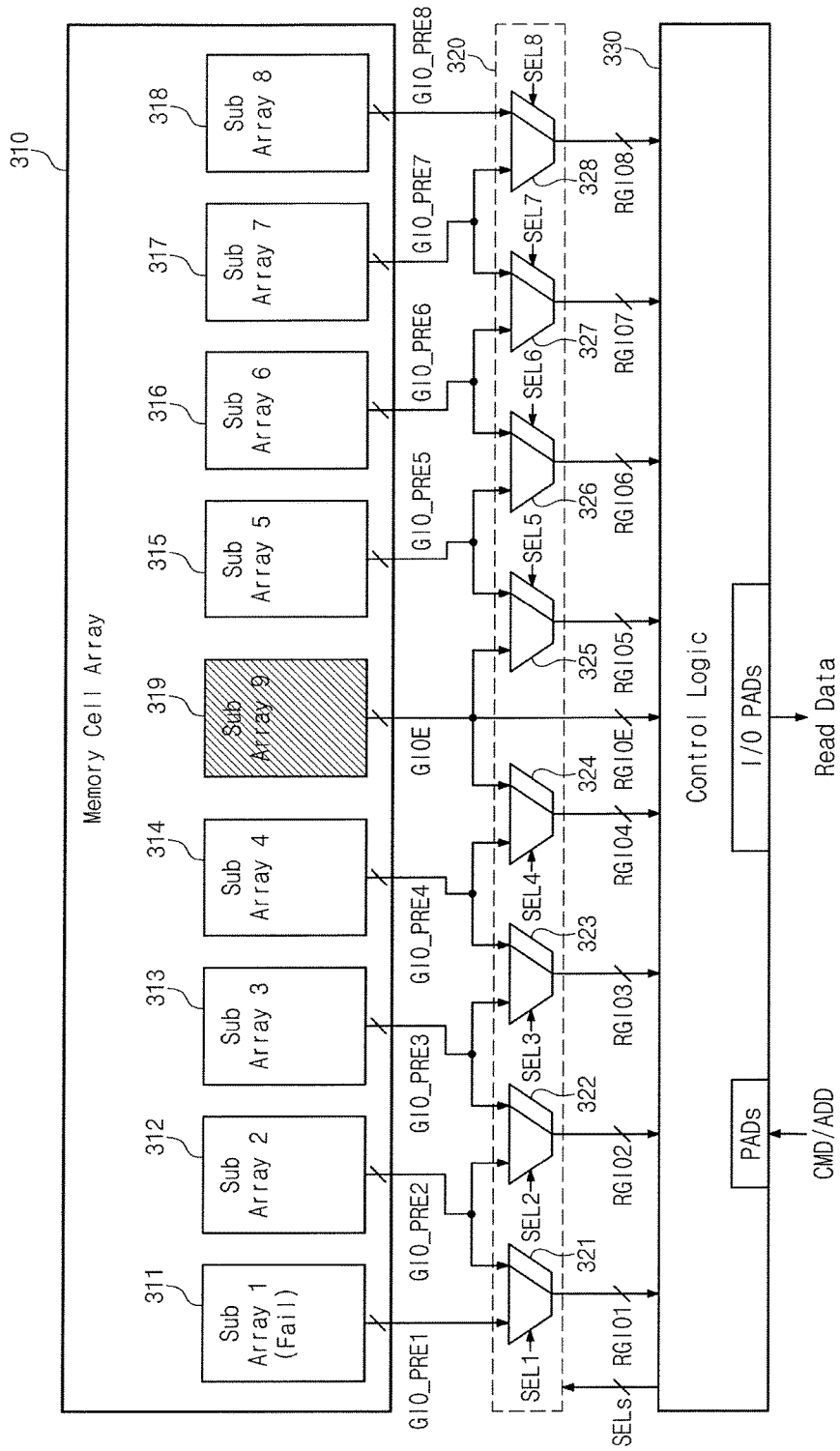
FIGS. 6 and 7 are block diagrams illustrating a memory device that operates in a second mode, according to an exemplary embodiment of the inventive concept.
Figure 7:
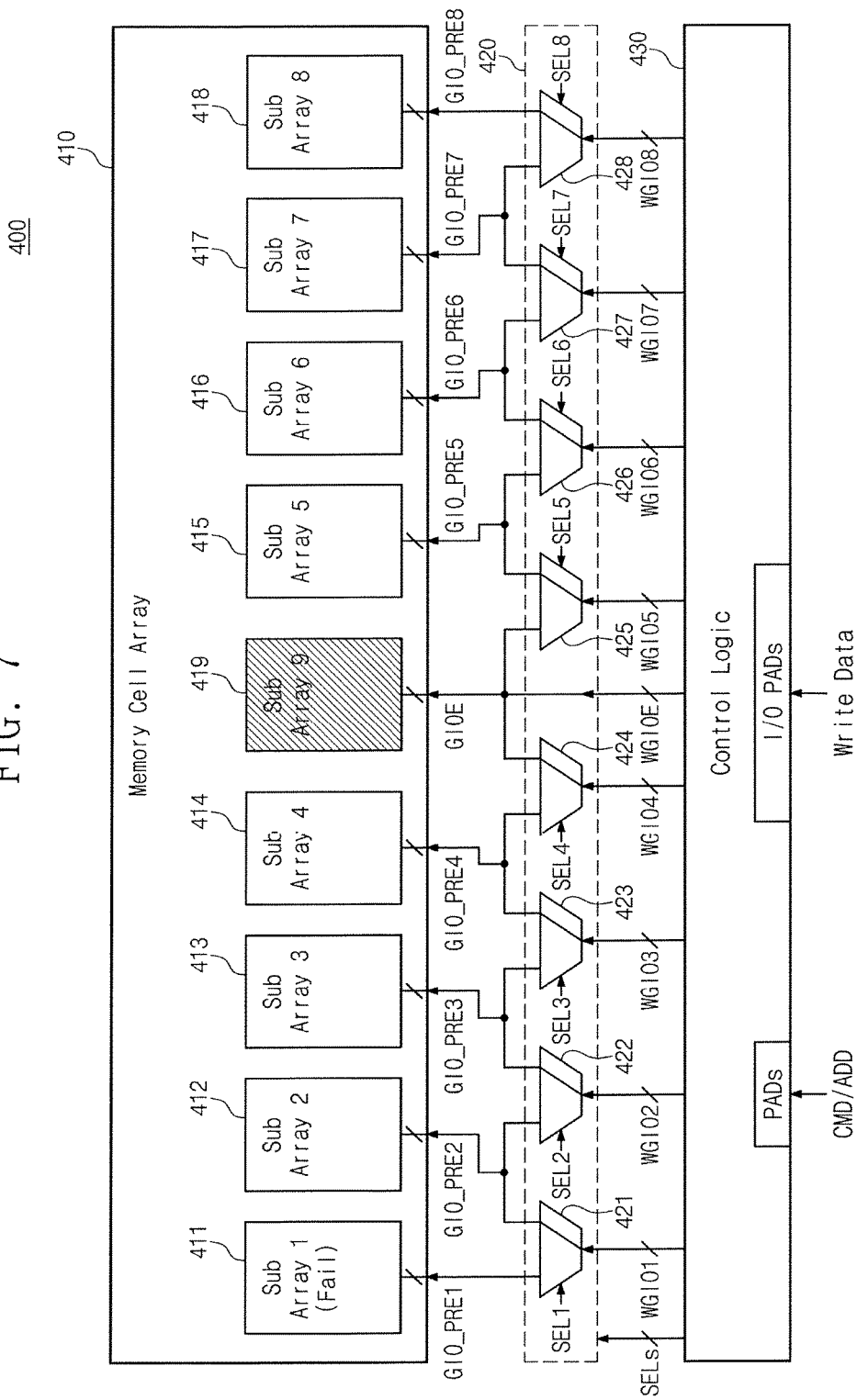

FIGS. 6 and 7 are block diagrams illustrating a memory device that operates in a second mode, according to an exemplary embodiment of the inventive concept. FIG. 6 relates to a case where a memory device 300 performs a read operation in a second mode. FIG. 7 relates to a case where a memory device 400 performs a write operation in the second mode. The second mode relates to a case where extra capacity inside the memory device is not made available to another circuit, but the extra capacity is used as a repair area. When the memory device operates in the second mode, failed memory cells may be repaired by extra capacity.

FIG. 6 relates to a case where the memory device 300 performs a read operation in the second mode. FIG. 6 will be described with reference to FIG. 3. Referring to FIG. 6, the memory device 300 may include a memory cell array 310, a multiplexing circuit 320, and control logic circuit 330. The memory device 300, the memory cell array 310, the multiplexing circuit 320, and the control logic circuit 330 perform the same function as the memory device 100, the memory cell array 110, the multiplexing circuit 120, and the control logic circuit 130 respectively. Since the memory device 300 performs a read operation in the second mode, a description thereof will be provided below.

Referring to FIG. 6, it is assumed that a first sub memory cell array 311 includes failed memory cells. When the number of failed memory cells is greater than the number of extra memory cells which the first sub memory cell array 311 has, the first sub memory cell array 311 may be treated as a failure. However, a criterion used to determine whether the first sub memory cell array 311 is treated as a failure is not limited thereto. In this case, the memory device 300 can repair the first sub memory cell array 311 using a ninth sub memory cell array 319.

Referring to FIG. 6, the memory device 300 does not use the first sub memory cell array 311. Instead, the memory device 300 may sequentially allocate a second sub memory cell array 312, a third sub memory cell array 313, a fourth sub memory cell array 314, the ninth sub memory cell array 319, a fifth sub memory cell array 315, a sixth sub memory cell array 316, a seventh sub memory cell array 317, and an eighth sub memory cell array 318 to the I/O pads. As illustrated in FIG. 6, the first sub memory cell array 311 is not repaired with the ninth sub memory array 319 immediately. When the ninth sub memory cell array 319 is disposed adjacent to the right side of the first sub memory cell array 311, the first sub memory cell array 311 may be repaired with the ninth sub memory array 319 immediately. For example, even when the ninth sub memory cell array 319 is not disposed at the center of the memory cell array 310, the memory device 300 may support both the first mode and the second mode.

To repair the first sub memory cell array 311, the multiplexing circuit 320 may operates as follows. A first read multiplexer array 321 may connect a second global pre-line set (GIO_PRE2) to a first read global line set RGIO1 in response to a first select signal SEL1. A fourth read multiplexer array 324 may connect a ninth global pre-line set (GIOE) to a fourth read global line set RGIO4 in response to a fourth select signal SEL4. A fifth read multiplexer array 325 may connect a fifth global pre-line set (GIO PRE5) to a fifth read global line set RGIO5 in response to a fifth select signal SEL5. As illustrated in FIG. 6, the remaining read multiplexer arrays 322, 323, 326, 327 and 328 may also connect global pre-line sets and read global line sets.

Referring to FIG. 6, the multiplexing circuit 320 may connect the ninth global pre-line set (GIOE) to a ninth read global line set RGIOE immediately. Since the memory device 300 operates in the second mode, the control logic circuit 330 does not output read data included in the ninth read global line set RGIOE to another circuit. An operation of the control logic circuit 330 will be described in FIGS. 11 and 12.

FIG. 7 relates to a case where the memory device 300 performs a write operation in the second mode. FIG. 7 will be described with reference to FIG. 4. Referring to FIG. 7, the memory device 400 may include a memory cell array 410, a multiplexing circuit 420, and a control logic circuit 430. The memory device 400, the memory cell array 410, the multiplexing circuit 420, and the control logic circuit 430 perform the same function as the memory device 200, memory cell array 210, the multiplexing circuit 220, and the control logic circuit 230 respectively. Since the memory device 400 performs a write operation in the second mode, a description thereof will be described below.

Referring to FIG. 7, the memory device 400 does not use a first sub memory cell array 411. For example, the memory device 400 may sequentially allocate a second sub memory cell array 412, a third sub memory cell array 413, a fourth sub memory cell array 414, a ninth sub memory cell array 419, a fifth sub memory cell array 415, a sixth sub memory cell array 416, a seventh sub memory cell array 417, and an eighth sub memory cell array 418 to the I/O pads.

To repair the first sub memory cell array 411, the multiplexing circuit 420 may operate as follows. A first write multiplexer array 421 may connect a first write global line set WGIO1 to a second global pre-line set (GIO PRE2) in response to a first select signal SEL1. A fourth write multiplexer array 424 may connect a fourth write global line set WGIO4 to a ninth global pre-line set (GIOE) in response to a fourth select signal SEL4. A fifth write multiplexer array 325 may connect a fifth write global line set WGIO5 to a fifth global pre-line set (GIO_PRE5) in response to a fifth select signal SEL5. As illustrated in FIG. 7, the remaining read multiplexer arrays 422, 423, 426, 427 and 428 may also connect global pre-line sets and read global line sets.

Referring to FIG. 7, the multiplexing circuit 420 may connect a ninth write global line set WGIOE to the ninth global pre-line set (GIOE) immediately. Since the memory device 400 operates in the second mode, the control logic circuit 430 may control write data not to be received through the ninth write global line set WGIOE. An operation of the control logic circuit 430 will be described in FIGS. 11 and 12.

Figure 8:
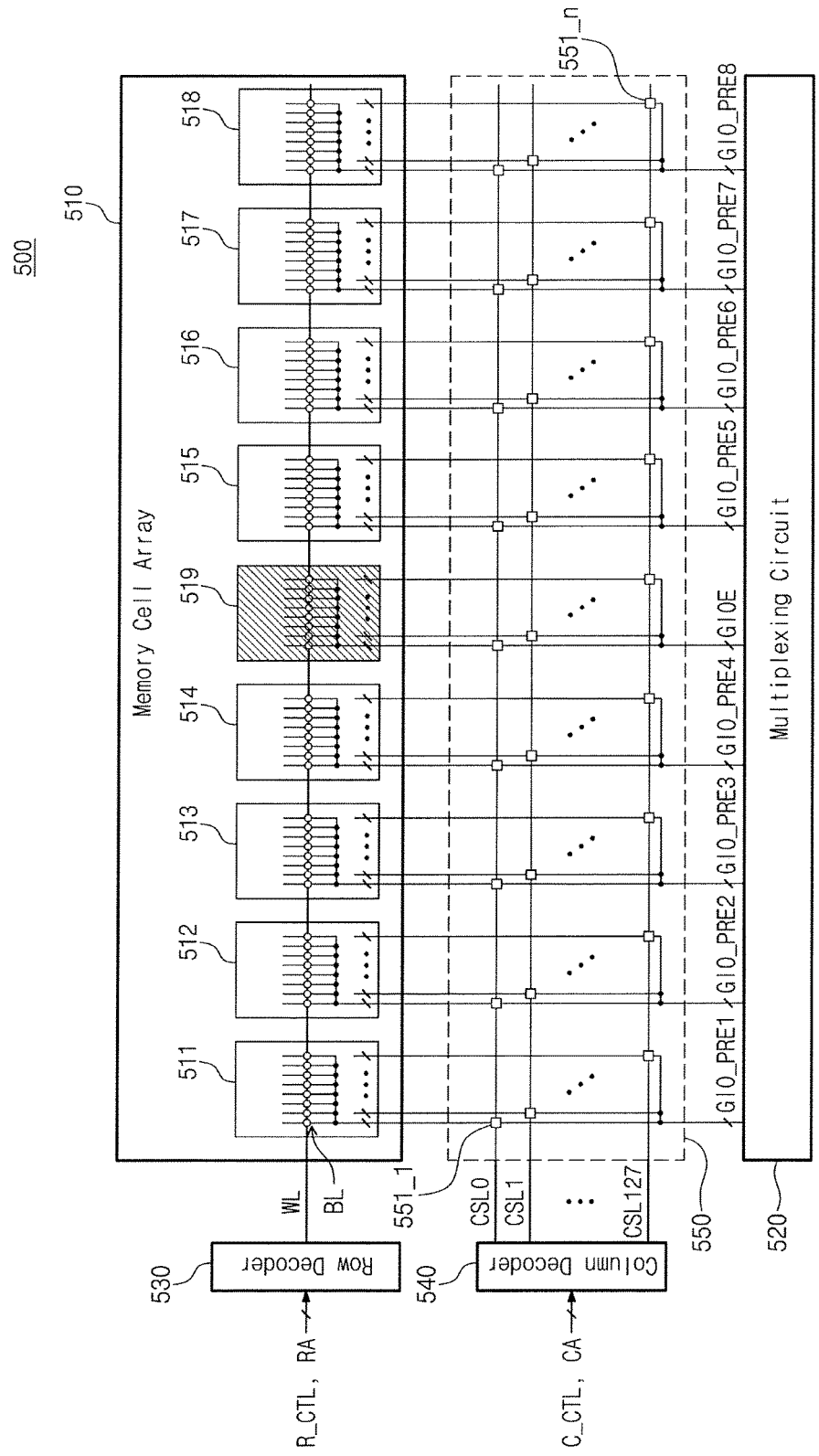
FIG. 8 is a block diagram illustrating a part of a memory device according to an exemplary embodiment of the inventive concept.

FIG. 8 is a block diagram illustrating a part of a memory device according to an exemplary embodiment of the inventive concept. FIG. 8 will be described with reference to FIGS. 3, 4, 6 and 7. Referring to FIG. 8, a memory device 500 may include a memory cell array 510, a multiplexing circuit 520, a row decoder 530, a column decoder 540, and a column select circuit 550. Since the multiplexing circuit 520 performs the same function as the multiplexing circuits 120, 220, 320 and 420 described in connection with FIGS. 3, 4, 6 and 7, a description thereof will be omitted for brevity.

The memory cell array 510 may include sub memory cell arrays (511 to 519). In a read operation, in each sub memory cell array of the memory cell array 510, stored data may be transmitted to another circuit through the I/O pads. For example, a first I/O pad may be allocated to the first sub memory cell array 511. A second, a third, a fourth, a fifth, a sixth, a seventh and an eighth I/O pad, respectively, may be allocated to the remaining sub memory cell arrays (512 to 518) respectively. A ninth I/O pad DQE may be allocated to the ninth sub memory cell array 519.

Each of the sub memory cell arrays (511 to 519) may include a plurality of word lines WLs and a plurality of bit lines BLs. A memory cell may be disposed at an intersection of a word line WL and a bit line BLs. Here, the memory cell may be, for example, a dynamic random access memory (DRAM).

The row decoder 530 may select at least one word line, among the plurality of word lines WLs, according to the control of the control logic circuit 430 (refer to FIG. 7). The row decoder 530 may receive a row decoder control signal R_CTL and row addresses (RA) from the control logic circuit 430 (refer to FIG. 7). The row decoder control signal R_CTL and row addresses (RA) may be generated by the control logic circuit 430 (refer to FIG. 7) in response to external commands. When word line addresses and an active command are input from another circuit to the memory device 500, the control logic circuit 430 (refer to FIG. 7) may activate the row decoder control signal R_CTL and may generate the row addresses (RA). Memory cells activated by the active command may be regarded as a selected page. When a precharge command is input from another circuit to the memory device 500, the control logic circuit 430 (refer to FIG. 7) may deactivate the row decoder control signal R_CTL.

The column decoder 540 may select at least one column signal, among the column select signals (CSL0 to CSL127), according to a control of the control logic circuit 430 (refer to FIG. 7). The number of column select signals is not limited to that illustrated in FIG. 8. The column decoder 540 may receive a column decoder control signal C_CTL and column addresses (CA) from the control logic circuit 430 (refer to FIG. 7). For example, after the active command, a write command or a read command may be input from another circuit to the memory device 500. When a write command or a read command is input from another circuit to the memory device 500 and bit line addresses of the memory device 500 are input, the control logic circuit 430 (refer to FIG. 7) may activate the column decoder control signal C_CTL and may generate the column addresses (CA). When a write operation and a read operation is finished, the control logic circuit 430 (refer to FIG. 7) may deactivate the column decoder control signal C_CTL.

The column select circuit 550 may transmit read data stored in the memory cell array 510 to the multiplexing circuit 520. The column select circuit 550 may transmit write data from the multiplexing circuit 520 to the memory cell array 510. The column select circuit 550 may include a plurality of sub column select circuits (551_1 to 551_n, n is a positive integer greater than 1). 8 bit lines BLs may be selected by the sub column select circuit 551_1. However, the number of bit lines selected by the sub column select circuit in the present inventive concept is not limited to 8. The sub column select circuit 551_1 may include 8 switches. The switches described above may be, for example, N-channel metal oxide semiconductors (NMOS). The switches may be turned on by the column select signals (CSL0 to CSL127).

The column select circuit 550 may connect the bit lines BLs to global pre-line sets (GIO_PRE1 to GIO_PRE8, and GIOE) in response to the column select signal (CSL0). Referring to FIG. 8, it is illustrated that the column select circuit 550 operates the sub column select circuit 551_1 in response to the column select signal CSL0. However, the column select circuit 550 may also operate the sub column select circuits (551_2 to 551_n) in response to the column select signals (CSL1 to CSL127).

Figure 9:
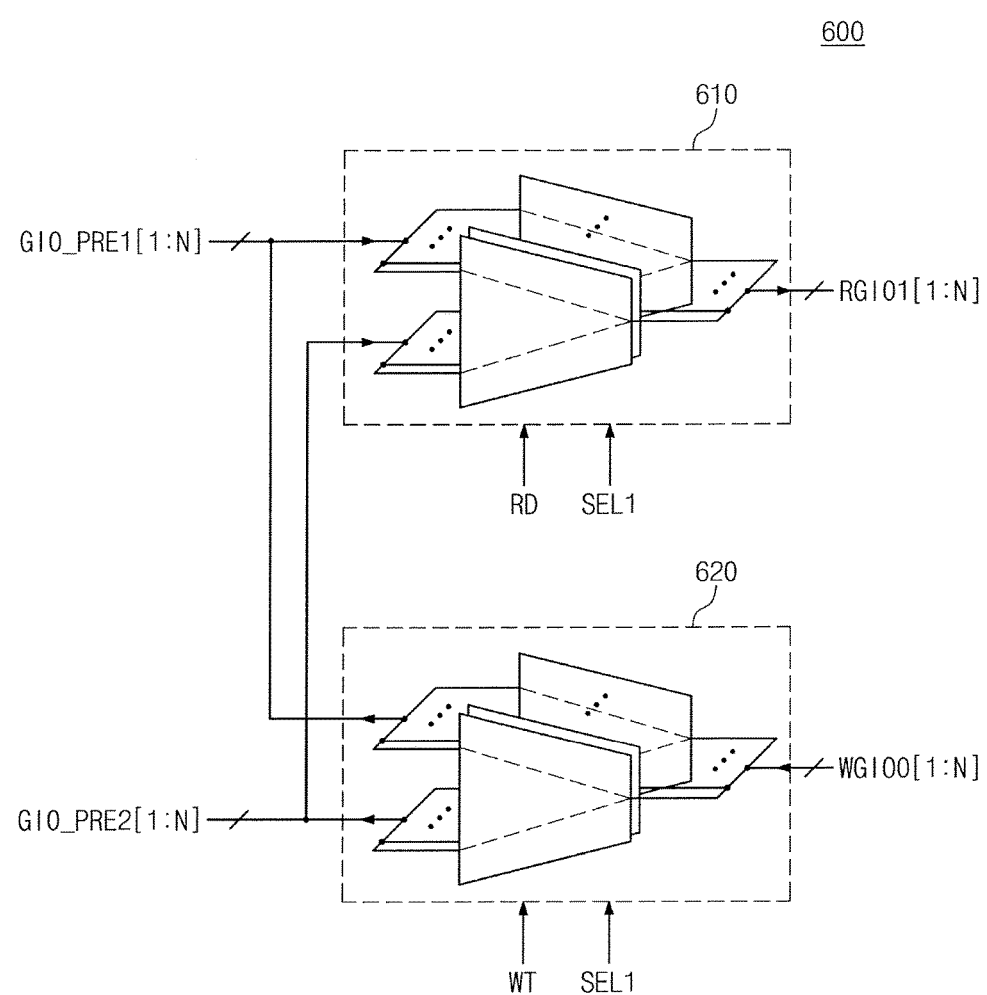
FIG. 9 is a block diagram illustrating a part of a multiplexing circuit illustrated in FIGS. 3, 4, 6 and 7, according to an exemplary embodiment of the inventive concept.

FIG. 9 is a block diagram illustrating a part of a multiplexing circuit illustrated in FIGS. 3, 4, 6 and 7, according to an exemplary embodiment of the inventive concept. FIG. 9 will be described with reference to FIGS. 3, 4, 6 and 7. A multiplexing circuit 600 may include read multiplexer arrays 610 and write multiplexer arrays 620.

The read multiplexer array 610 may include N multiplexers, and N is a nonzero positive integer. The N may be the number of bit lines BL selected by the sub column select circuit 555_1 (refer to FIG. 8). The multiplexer may include logical circuits (e.g., a NAND gate, a NOR gate, an inverter, etc.). When a read operation is performed with respect to the memory device, according to an exemplary embodiment of the inventive concept, the read multiplexer array 610 may select either a first global pre-line set (GIO_PRE1[1:N]) or a second global pre-line set (GIO_PRE2[1:N]) in response to a first select signal SEL1. The read multiplexer array 610 may output bits transmitted through the selected pre-line set to a first read global line set (RGIO1[1:N]). The read multiplexer array 610 may receive a read signal RD and may operate when a read operation is performed on the memory device. The read signal RD may be generated by the control logic circuit 430 (refer to FIG. 7).

A write multiplexer array 620 may include N number of multiplexers, and N is a nonzero positive integer. The multiplexer may include logical circuits (e.g., a NAND gate, a NOR gate, an inverter, etc.). When a write operation is performed with respect to the memory device, according to an exemplary embodiment of the inventive concept, the write multiplexer array 620 may select either the first global pre-line set (GIO_PRE1[1:N]) or the second global pre-line set (GIO_PRE2[1:N]) in response to the first select signal SELL The write multiplexer array 620 may output bits transmitted through a first write global line set (WGIO1[1:N]) to the selected pre-line set. The write multiplexer array 620 may receive a write signal WT and may operate when a write operation is performed on the memory device. The write signal WT may be generated by the control logic circuit 430 (refer to FIG. 7).

Referring to FIG. 9, the multiplexing circuit 600 may include the read multiplexer array 610 and the write multiplexer array 620, which respond to the control of the first select signal SELL The multiplexing circuit 600 may further include read multiplexer arrays and write multiplexer arrays that respond to the control of select signals (SEL2 to SEL8). The multiplexing circuit 600 may be applied to the multiplexing circuits 120, 220, 320 and 420 of the memory devices 100, 200, 300 and 400, illustrated in FIGS. 3, 4, 6 and 7.

Figure 10:
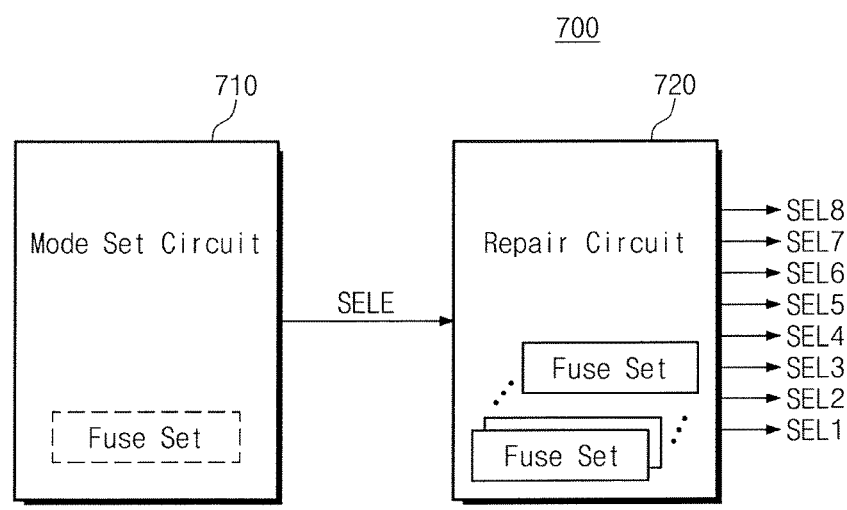
FIG. 10 is a block diagram illustrating a part of control logic circuit, according to an exemplary embodiment of the inventive concept.

FIG. 10 is a block diagram illustrating a part of control logic circuit, according to an exemplary embodiment of the inventive concept. FIG. 10 will be described with reference to FIGS. 3, 4, 6, 7 and 8. Referring to FIG. 10, control logic circuit 700 may include a mode of operation set circuit 710 and a multiplexer control circuit 720.

The mode of operation set circuit 710 may set either a first mode or a second mode. As described above, the first mode may indicate a case where the extra capacity inside the memory device is made available to another circuit. The second mode may indicate a case where the extra capacity inside the memory device is not made available to another circuit, but the extra capacity is used as a repair area.

The mode of operation set circuit 710 may include a fuse set inside of it. The fuse set may include a laser fuse or an E-fuse. The laser fuse is cut at a wafer level before a memory device is packaged. The E-fuse is cut by applying a large amount of current in a moment. Since the E-fuse can be applied even after a memory device is packaged, it may be convenient to use as compared with the laser fuse. The mode of operation set circuit 710 may set either the first mode or the second mode through the fuse set. For example, the first mode or the second mode of the memory device may be set through a fuse cutting. For example, the fuse cutting may be performed at the production stage of the memory device.

The mode of operation set circuit 710 may receive a mode register set (MRS) command instead of the fuse set. The mode of operation set circuit 710 may set either the first mode or the second mode. Generally, the memory device may set several parameters such as latency, burst length, etc., and an operation mode in response to the MRS command. When the mode of operation set circuit 710 receives the MRS command, the mode of operation set circuit 710 may not include the fuse set. For example, the MRS command to set the first mode or the second mode of the memory device, according to an exemplary embodiment of the inventive concept, may be input at a stage when a user uses the memory device.

The mode of operation set circuit 710 may set the first mode or the second mode through the MRS command or the fuse set. The mode of operation set circuit 710 may output a setting result to a mode of operation signal SELE.

The multiplexer control circuit 720 may generate select signals (SEL1 to SEL8) to control the multiplexing circuits 120, 220, 320 and 420 (refer to FIGS. 3, 4, 6 and 7). The multiplexer control circuit 720 may include a plurality of fuse sets. The number of fuse sets may be the same as the number of sub memory cell arrays 411 to 419 (refer to FIG. 7). When the memory device includes a plurality of memory cell arrays, the number of fuse sets may be a value obtained by adding the number of sub memory cell arrays (refer to FIG. 7) included in each of the plurality of memory cell arrays. When the memory device operates in the second mode, in the plurality of fuse sets inside the multiplexer control circuit 720, it may be determined whether a fuse is cut based on whether a defect occurs in the sub memory cell arrays 411 to 418 (refer to FIG. 7). The aforementioned fuse cutting result may be transmitted to the memory cell array 510, the row decoder 530, the column decoder 540, and the column select circuit 550 that are illustrated in FIG. 8. Using the aforementioned fuse cutting result, each of the memory cell array 510, the row decoder 530, the column decoder 540, and the column select circuit 550 may not operate circuits that drive a failed sub memory cell array.

The multiplexer control circuit 720 may further include a logic circuit. The logic circuit may receive a cutting result of the fuse sets and may generate the select signals (SEL1 to SEL8). Operations of the select signals (SEL1 to SEL8) were described in FIGS. 3, 4, 6 and 7.

The multiplexer control circuit 720 may receive the mode of operation signal SELE from the mode of operation set circuit 710. Through the mode of operation signal SELE, the multiplexer control circuit 720 may determine whether the memory device operates in the first mode or in the second mode. In the first mode, the memory device may not perform a repair operation through a fuse cutting. In the second mode, the memory device may perform a repair operation through a fuse cutting.

The control logic circuit 700 may be applied to the control logic circuits 130, 230, 330 and 430 of the memory devices 100, 200, 300 and 400 illustrated in FIGS. 3, 4, 6 and 7.

Figure 11:
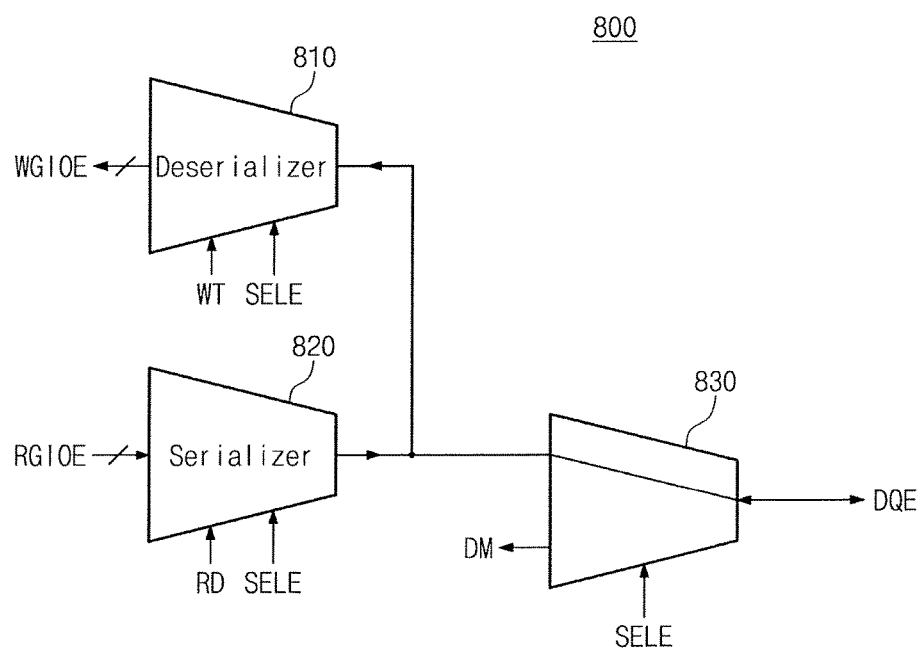
FIGS. 11 and 12 are block diagrams illustrating a part of control logic circuit illustrated in FIGS. 3, 4, 6 and 7, an exemplary embodiment of the inventive concept.
Figure 12:
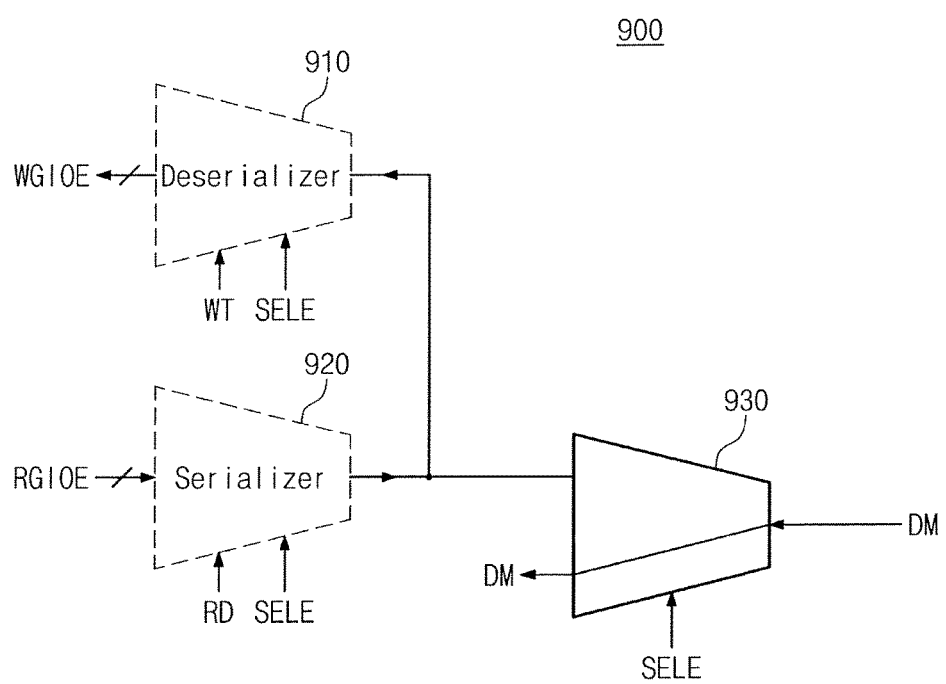

FIGS. 11 and 12 are block diagrams illustrating a part of control logic circuit illustrated in FIGS. 3, 4, 6 and 7, an exemplary embodiment of the inventive concept. FIG. 11 illustrates a case where the memory device 300, according to an exemplary embodiment of the inventive concept, operates in the first mode. FIG. 12 illustrates a case where the memory device 300, according to an exemplary embodiment of the inventive concept, operates in the second mode. FIGS. 11 and 12 will be described with reference to FIGS. 3, 4, 6 and 7.

Referring to FIG. 11, a control logic circuit 800 may include a deserializer 810, a serializer 820, and a multiplexer 830. The deserializer 810 may deserialize write data input from another circuit in response to the write signal WT. The deserializer 810 may transmit deserialized write data to the multiplexing circuit 120, 220, 320 and 420 of FIGS. 3, 4, 6 and 7 through the ninth global line set WGIOE. When a write operation is performed with respect to the memory device, the deserializer 810 may operate. The deserializer 810 may perform a deserializing operation in the first mode and may not perform a deserializing operation in the second mode. To operate, the deserializer 810 may receive the mode of operation signal SELE from the mode of operation set circuit 710 (refer to FIG. 10).

The serializer 820 may serialize read data input from the multiplexing circuit 120, 220, 320 and 420 of FIGS. 3, 4, 6 and 7 in response to the read signal RD. The serializer 820 may transmit serialized read data to a multiplexer 830. When a read operation is performed with respect to the memory device, the serializer 820 may operate. The serializer 820 may perform a serializing operation in the first mode and may not perform a serializing operation in the second mode. To operate, the serializer 820 may receive the mode of operation signal SELE from the mode of operation set circuit 710 (refer to FIG. 10).

The multiplexer 830 may connect an I/O pad to the deserializer 810 and the serializer 820 in response to the mode of operation signal SELE. When the memory device operates in the first mode, the multiplexer 830 may connect the I/O pad to the deserializer 810 and the serializer 820. When the memory device operates in the second mode, the multiplexer 830 may not connect the I/O pad to the deserializer 810 and the serializer 820. The multiplexer 830 may include logical circuits (e.g., a NAND gate, a NOR gate, an inverter, etc.).

Referring to FIG. 12, a control logic circuit 900 may include a deserializer 910, a serializer 920, and a multiplexer 930. The deserializer 910, the serializer 920, and the multiplexer 930 may perform the same function as the deserializer 810, the serializer 820, and the multiplexer 830. When the memory device operates in the second mode, the deserializer 910 and the serializer 920 may not operate by the mode of operation signal SELE.

The multiplexer 930 may transmit a data mask (DM) signal inside the control logic circuit 900 through an I/O pad in response to the mode of operation signal SELE. The memory device may mask some of write data inputted through a data mask operation. The masked write data may not be stored in the memory cell array. FIG. 12 illustrates a case where the I/O pad receives the DM signal. The memory device, according to an exemplary embodiment of the inventive concept, may receive or output other signals prescribed in a specification through the I/O pad. When the memory device operates in the first mode, the memory device may provide extra capacity to a user through the I/O pad. When the memory device operates in the second mode, the memory device may receive or output other signals prescribed in the specification through the I/O pad.

Figure 13:
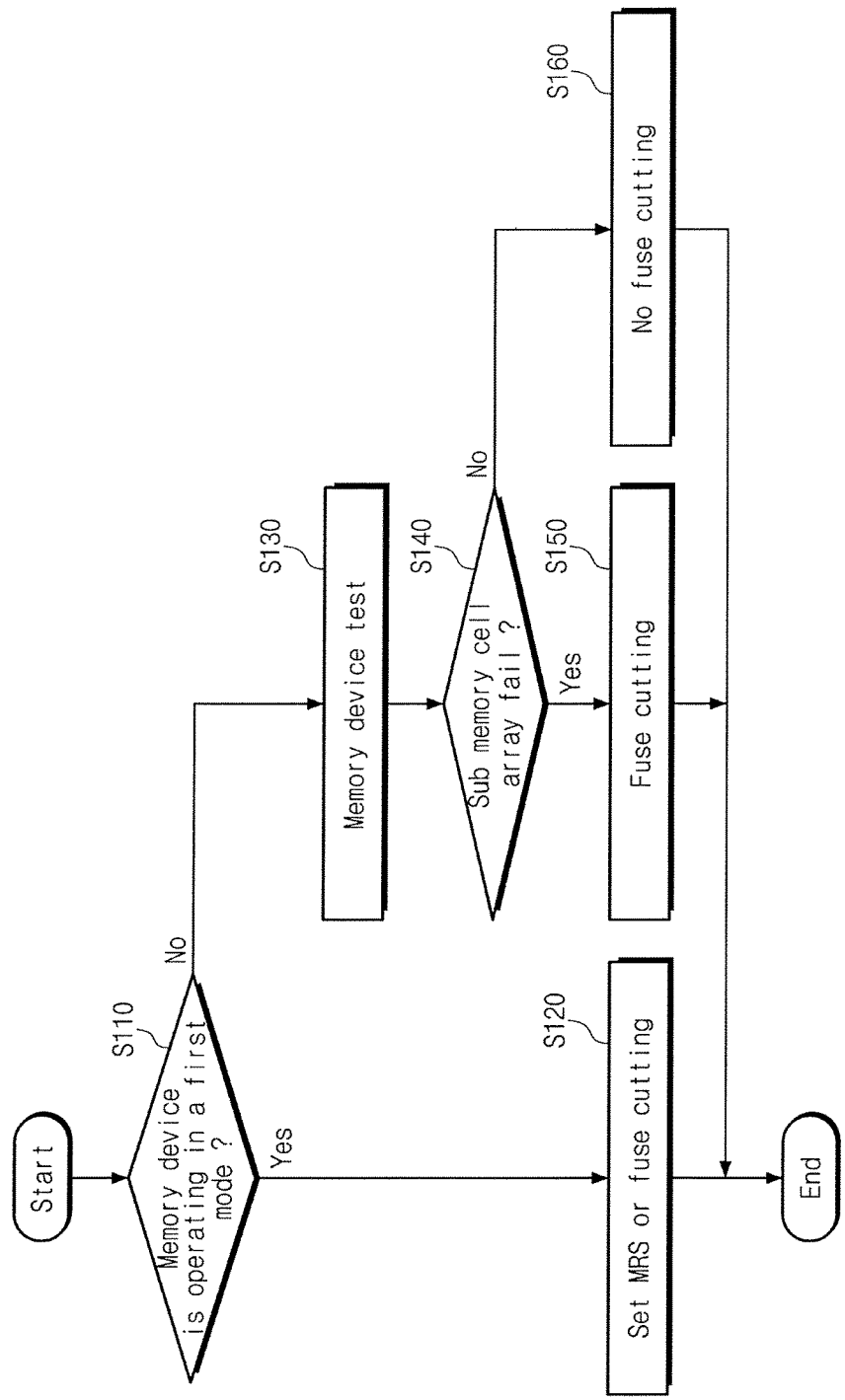
FIG. 13 is a flowchart illustrating a method of producing a memory device according to an exemplary embodiment of the inventive concept.

FIG. 13 is a flowchart illustrating a method of producing a memory device according to an exemplary embodiment of the inventive concept. FIG. 13 will be described with reference to FIGS. 3, 4, 6, 7 and 10.

In an operation S110, it may be determined whether the memory device operates in the first mode or in the second mode. As described above, the first mode means a case where extra capacity inside the memory device is made available to another circuit. The second mode means a case where extra capacity inside the memory device is not made available to another circuit but is used as a repair area. When the memory device operates in the first mode (Yes), an operation S120 is performed. When the memory device operates in the second mode (No), an operation S130 is performed.

In the operation S120, to operate the memory device in the first mode, the memory device may receive an MRS command from another circuit. The received MRS command may be transmitted to the mode of operation set circuit 710 (refer to FIG. 10). Alternatively, to operate the memory device in the first mode, a fuse set included in the mode of operation set circuit 710 (refer to FIG. 10) may be cut.

In the operation S130, the memory device may be tested. Through a test process, failed memory cells of each of sub memory cell arrays may be repaired with extra memory cells included in each of the sub memory cell arrays.

In an operation S140, through a test process, it may be determined whether sub memory cell arrays include a failed memory cell. When failed memory cells included in each of the sub memory cell arrays may not be repaired with extra memory cells included in each of the sub memory cell arrays, the sub memory cell arrays may be determined to be defective. However, a criterion used to determine whether the sub memory cell arrays are treated as a failure is not limited thereto. When the sub memory cell arrays include a failed memory cell (Yes), as determined in the operation S140, an operation S150 is performed. When the sub memory cell arrays do not include a failed memory cell (No), as determined in the operation S140, an operation S160 is performed.

In the operation S150, to repair the failed sub memory cell array with a ninth sub memory cell, the fuse sets included in the multiplexer control circuit 720 (refer to FIG. 10) may be cut. In the operation S160, fuse sets included in the multiplexer control circuit 720 (refer to FIG. 10) may not be cut.

Figure 14:
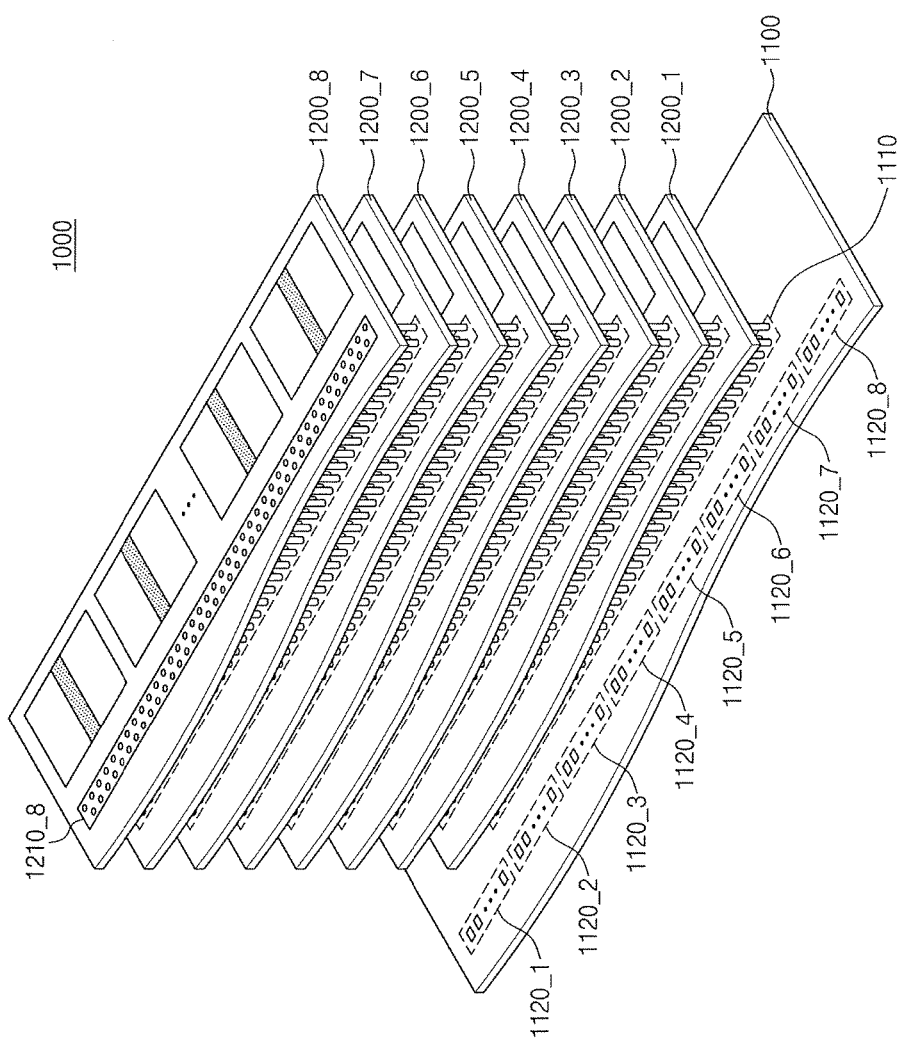
FIG. 14 is a block diagram illustrating a stacked memory device according to an exemplary embodiment of the inventive concept.

FIG. 14 is a block diagram illustrating a stacked memory device according to an exemplary embodiment of the inventive concept. FIG. 14 will be described with reference to FIGS. 3, 4, 6 and 7. Referring to FIG. 14, a stacked memory device 1000 may include memory dies (1200_1 to 1200_8) and a buffer die 1100. The number of memory dies (1200_1 to 1200_8) is not limited to that illustrated in FIG. 14. For example, in an exemplary embodiment of the inventive concept, more than eight memory dies or less than eight memory dies may be included in a stacked memory device.

Each of the memory dies (1200_1 to 1200_8) may be one of the memory devices described in FIGS. 3, 4, 6 and 7. Each of the memory dies (1200_1 to 1200_8) may include memory cell arrays. The memory cell array may include a ninth sub memory cell array. The memory cell array and the ninth sub memory cell array were described in FIGS. 3, 4, 6 and 7.

Each of the memory dies (1200_1 to 1200_8) may further include through silicon via (TSV) areas (1210_1 to 1210_8) besides the memory device described above. The TSV areas (1210_1 to 1210_8) may include a plurality of TSVs. The TSVs may be connected to the memory cell array described above. Through the TSVs, data to be stored in the memory cell array may be transmitted from the buffer die 1100, or data stored in the memory cell array may be transmitted to the buffer die 1100. In the stacked memory device 1000, the memory dies (1200_1 to 1200_8) may be stacked through the through silicon via (TSV) areas (1210_1 to 1210_8). As the memory dies (1200_1 to 1200_8) are stacked, the total capacity of the stacked memory device 1000 may gradually increase.

The buffer die 1100 may include a TSV area 1110 and I/O pads (1120_1 to 1120_8). The buffer die 1100 may transmit commands, addresses, or write data inputted from another circuit through the TSV area 1110 to the memory dies (1200_1 to 1200_8). The buffer die 1100 may transmit read data from the memory dies (1200_1 to 1200_8) to another circuit through the TSV area 1110.

Referring to FIG. 14, the I/O pads (1120_1 to 1120_8) may be disposed on the buffer die 1100. The buffer die 1100 may write data in the memory die 1200_1 or read data from the memory die 1200_1 through the I/O pad 1120_1, the I/O pad 1120_2 may write data in the memory die 1200_2 or read data from the memory die 1200_2 through the I/O pad 1120_2, and so on.

Figure 15:
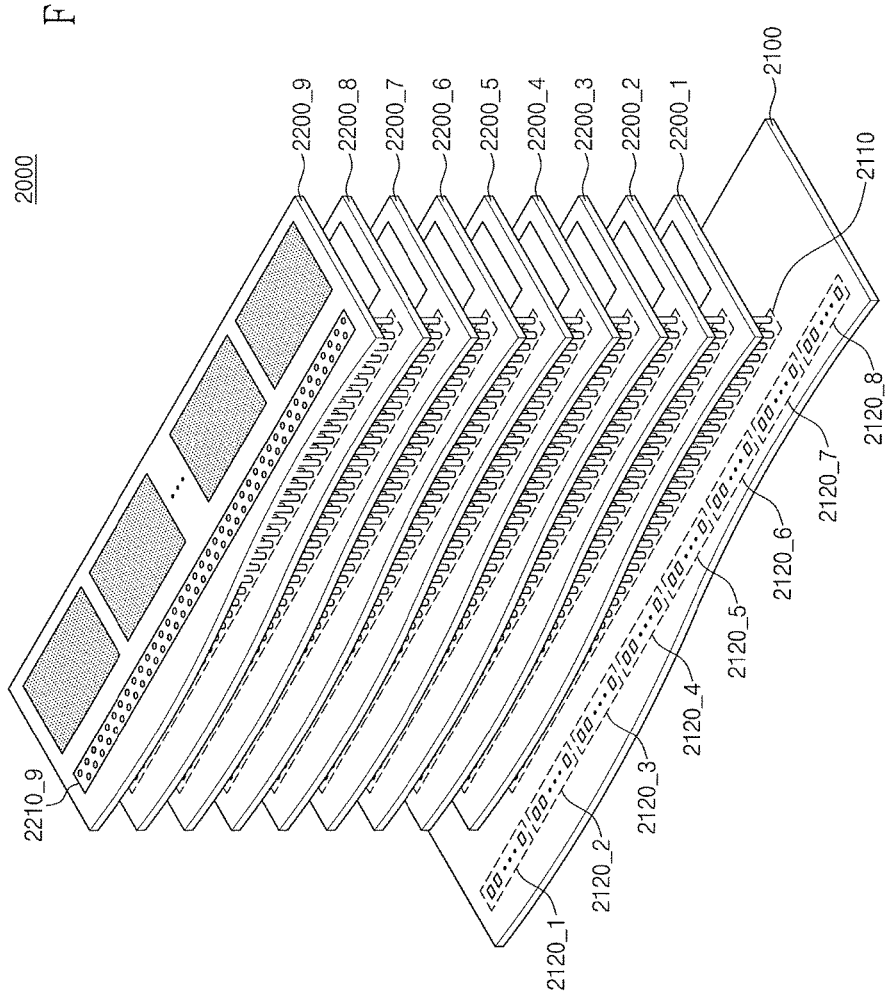
FIG. 15 is a block diagram illustrating a stacked memory device according to an exemplary embodiment of the inventive concept.

FIG. 15 is a block diagram illustrating a stacked memory device according to an exemplary embodiment of the inventive concept. FIG. 15 will be described with reference to FIGS. 3, 4, 6 and 7. Referring to FIG. 15, a stacked memory device 2000 may include memory dies (2200_1 to 2200_9) and a buffer die 2100. The number of memory dies (2200_1 to 2200_9) is not limited to that illustrated in FIG. 15. For example, in an exemplary embodiment of the inventive concept, more than nine memory dies or less than nine memory dies may be included in a stacked memory device. The total capacity of the stacked memory device 2000 may be equal to the total capacity of the stacked memory device 1000.

The memory dies (2200_1 to 2200_8) may not include a ninth sub memory cell array. However, the memory die 2200_9 may include the ninth sub memory cell array. In the stacked memory device 1000 (refer to FIG. 14), extra capacity may be disposed at each of the memory dies (1200_1 to 1200_8) (refer to FIG. 14). In the stacked memory device 2000, extra capacity may be disposed at a separate memory die, for example, the memory die 2200_9. Referring to FIG. 15, the stacked memory device 2000 can repair failed sub memory cell arrays included in the memory dies (2200_1 to 2200_8) through the ninth sub memory cell array disposed at the memory die 2200_9.

The buffer die 2100 may include a TSV area 2110 and I/O pads (2120_1 to 2120_8). The buffer die 2100 may transmit commands, addresses, or write data inputted from another circuit through the TSV area 2110 to the memory dies (2200_1 to 2200_9). The buffer die 2100 may transmit read data from the memory dies (2200_1 to 2200_9) to another circuit through the TSV area 2110.

Referring to FIG. 15, the I/O pads (2120_1 to 2120_8) may be disposed on the buffer die 2100. The buffer die 2100 may write data in the memory dies 2200_1 and 2200_9 or read data from the memory die 2200_1 and 2200_9 through the I/O pad 2120_1. The buffer die 2100 may write data in the memory dies 2200_2 and 2200_9 or read data from the memory die 2200_2 and 2200_9 through the I/O pad 2120_2, The buffer die 2100 may write data in the memory dies 2200_3 and 2200_9 or read data from the memory die 2200_3 and 2200_9 through the I/O pad 2120_3, and so on.

Figure 16:
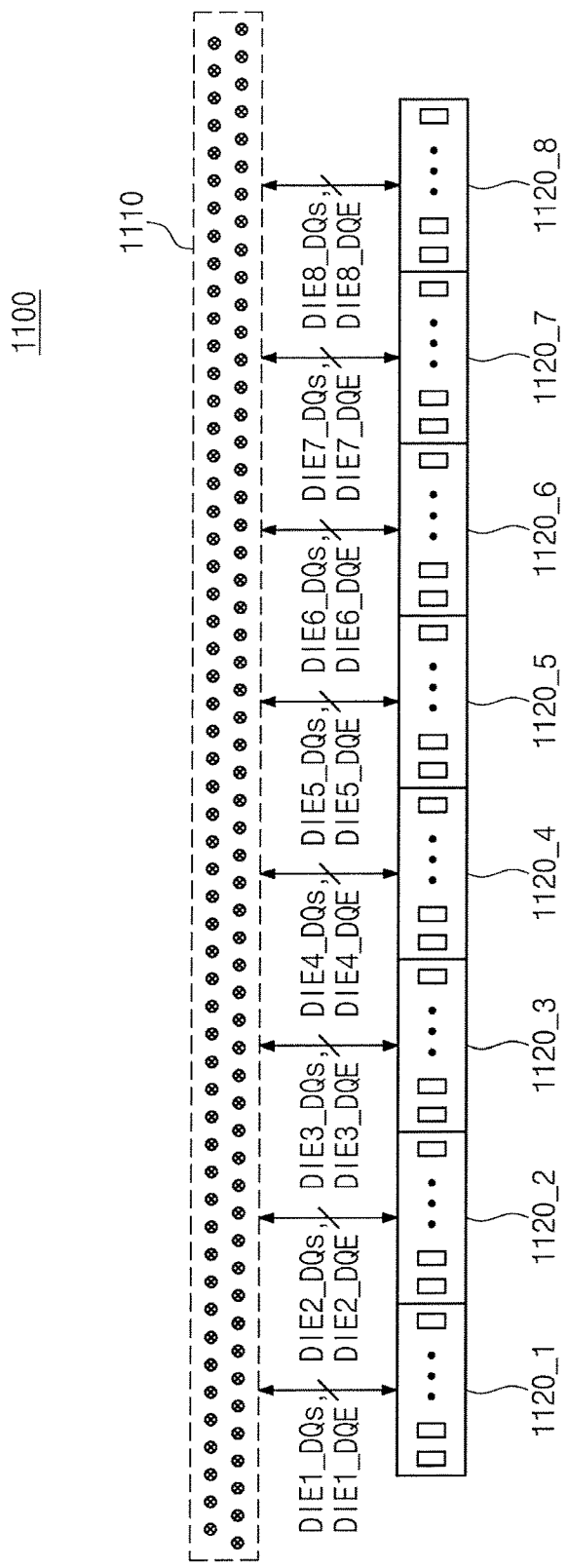
FIG. 16 is a block diagram illustrating a buffer die according to an exemplary embodiment of the inventive concept.

FIG. 16 is a block diagram illustrating a buffer die according to an exemplary embodiment of the inventive concept. FIG. 16 will be described with reference to FIGS. 3, 4, 6, 7 and 14. Referring to FIG. 16, the buffer die 1100 may include the TSV area 1110 and the I/O pads (1120_1 to 1120_8). When a read command is performed with respect to the stacked memory device 1000 in the first mode, data (DIE1_DQs) and additional data (DIE1_DQE) of the memory die 1200_1 may be transmitted to the buffer die 1100 through the TSV area 1110. Here, the data (DIE1_DQs) may mean data stored in sub memory cell arrays of the memory die 1200_1. The additional data (DIE1_DQE) may mean data stored in the ninth sub memory cell array of the memory die 1200_1. The transmitted data (DIE1_DQs) and additional data (DIE1_DQE) may be transmitted to another circuit through the I/O pad 1120_1. When a write command is performed with respect to the stacked memory device 1000 in the first mode, the buffer die 1100 may receive write data through the I/O pad 1120_1. The buffer die 1100 may transmit the data (DIE1 DQs) and the additional data (DIE1_DQE) to the memory die 1200_1 through the TSV area 1110.

When the stacked memory device 1000 operates in the second mode, the additional data (DIE1_DQE) may be replaced with other data. For example, the additional data (DIE1_DQE) may be replaced with data needed to perform a data mask operation. Referring to FIG. 16, each of the remaining memory dies (1200_2 to 1200_8) may perform the same function as the memory die 1200_1.

Figure 17:
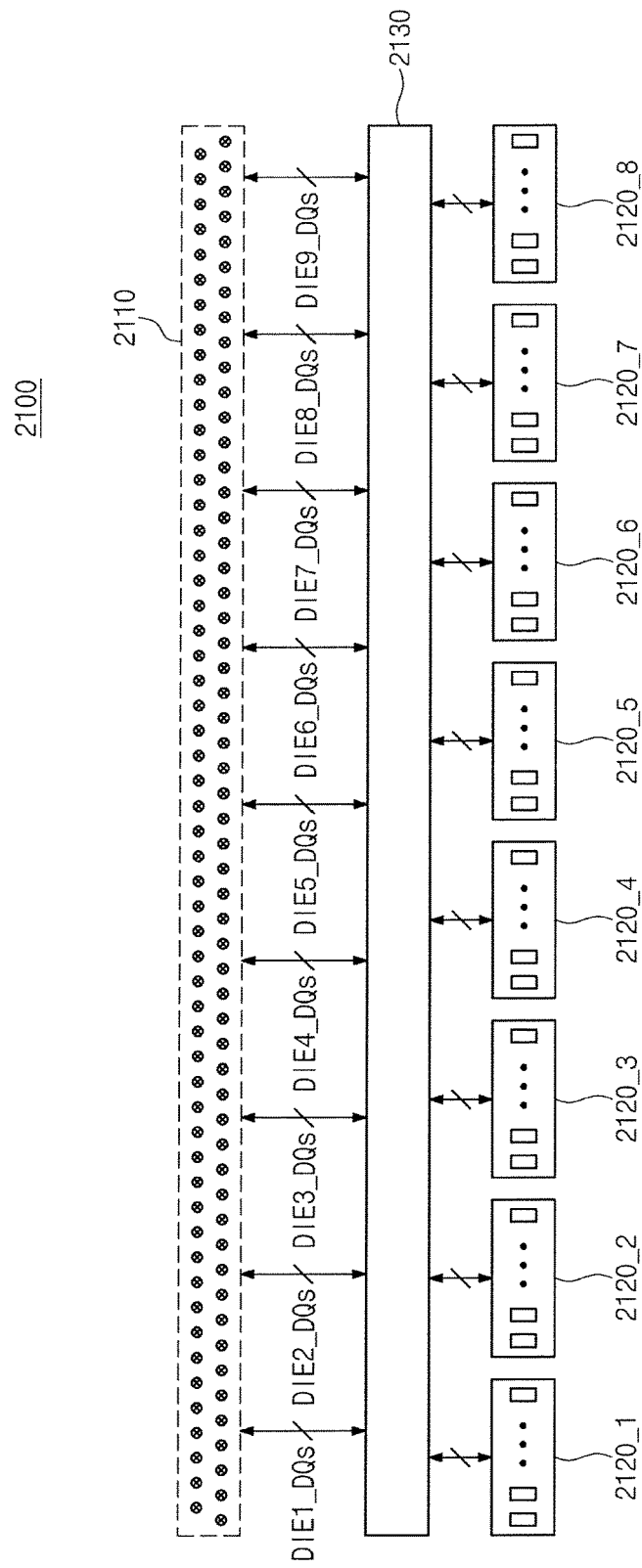
FIG. 17 is a block diagram illustrating a buffer die according to an exemplary embodiment of the inventive concept.

FIG. 17 is a block diagram illustrating a buffer die according to an exemplary embodiment of the inventive concept. FIG. 17 will be described with reference to FIG. 15. Referring to FIG. 17, the buffer die 2100 may include the TSV area 2110 and the I/O pads (2120_1 to 2120_8).

The buffer die 2100 may further include a multiplexing circuit 2130. The multiplexing circuit 2130 may be include the same circuitry as the multiplexing circuit illustrated in FIGS. 3, 4, 6 and 7. The multiplexing circuit 2130 may have different I/O signals from the multiplexing circuit illustrated in FIGS. 3, 4, 6 and 7. Since the TSV area 2110 and the I/O pads (2120_1 to 2120_8) perform the same function as the TSV area 1110 and the I/O pads (1120_1 to 1120_8) illustrated in FIG. 16, respectively, a description thereof will be omitted for brevity.

When a read command is performed with respect to the stacked memory device 2000 in the first mode, data (DIE1_DQs) of the memory die 2200_1 and additional data (DIE9_DQs) of the memory die 2200_9 may be transmitted to the buffer die 2100 through the TSV area 2110. The transmitted data (DIE1 DQs) and additional data (DIE9_DQs) may be transmitted to the multiplexing circuit 2130. The multiplexing circuit 2130 may transmit the transmitted data (DIE1_DQs) and the additional data (DIE9_DQs) to another circuit through the I/O 2120_1.

When a write command is performed with respect to the stacked memory device 2000 in the first mode, the buffer die 2100 may receive write data through the I/O pad 2120_1. The received write data may be transmitted to the multiplexing circuit 2130. After that, the buffer die 2100 may transmit the data (DIE1_DQs) and additional data (DIE9_DQs) to the memory die 2200_1 through the TSV area 2110. Referring to FIG. 17, each of the remaining memory dies (2200_2 to 2200_8) may perform the same function as the memory die 2200_1.

When the stacked memory device 2000 operates in the second mode, the multiplexing circuit 2130 can repair failed data among data (DIE1_DQs to DIE8_DQs) of the memory dies (2200_1 to 2200_8) through additional data (DIE9_DQs).

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A memory device, comprising:
a memory cell array including a first sub memory cell array, a second sub memory cell array, and a third sub memory cell array;
a multiplexing circuit that selects the first sub memory cell array, the second sub memory cell array, and the third sub memory cell array in a first mode of operation for data input/output (I/O) operations from/to an external device, and when the first sub memory cell array is defective in a second mode of operation, deselects the first sub memory cell array and selects the second sub memory cell array and the third sub memory cell array, wherein in the second mode of operation, the second sub memory cell array is used for repair of the first sub memory cell array; and
a control logic circuit that selects the first mode of operation or the second mode of operation, wherein the control logic circuit controls the multiplexing circuit so that the first and second sub memory cell arrays are connected to input or output pads, wherein the control logic circuit controls the third sub memory cell array so that the third sub memory cell array is connected to the input or output pads.

2. The memory device of claim 1, wherein the multiplexing circuit comprises:
a first read multiplexer array that selects the first sub memory cell array or the second sub memory cell array;
a second read multiplexer array that selects the second sub memory cell array or the third sub memory cell array;
a first write multiplexer array that selects the first sub memory cell array or the second sub memory cell array; and
a second write multiplexer array that selects the second sub memory cell array or the third sub memory cell array.

3. The memory device of claim 2, wherein in the first mode of operation, the second read multiplexer array selects the second sub memory cell array in a read operation, and
wherein in the first mode of operation, the second write multiplexer array selects the second sub memory cell array in a write operation.

4. The memory device of claim 2, wherein when the first memory cell array is defective in the second mode of operation,
the first read multiplexer array selects the second sub memory cell array in a read operation, and the first write multiplexer array selects the second sub memory cell array in a write operation.

5. The memory device of claim 2, wherein in the second mode of operation, when a defect does not exist in the first sub memory cell array and the second sub memory cell array, the second read multiplexer array selects the second sub memory cell array in a read operation, and when a defect exists in the first sub memory cell array or the second sub memory cell array, the second read multiplexer array selects the third sub memory cell array in the read operation, and
wherein in the second mode of operation, when a defect does not exist in the first sub memory cell array and the second sub memory cell array, the second write multiplexer array selects the second sub memory cell array in a write operation, and when a defect exists in the first sub memory cell array or the second sub memory cell array, the second write multiplexer array selects the third sub memory cell array in the write operation.

6. The memory device of claim 1, wherein the control logic circuit comprises:
a mode of operation set circuit that sets the first mode of operation or the second mode of operation; and
a multiplexer control circuit that controls the multiplexing circuit based on the set mode of operation.

7. The memory device of claim 6, wherein the control logic circuit further comprises a multiplexer that, in response to the set mode of operation, connects the third sub memory cell array to the input or output pads in the first mode of operation, or cuts the third sub memory cell array off from the input or output pads in the second mode of operation.

8. The memory device of claim 6, wherein the mode of operation set circuit comprises a fuse set for setting the first mode of operation or the second mode of operation.

9. The memory device of claim 6, wherein the multiplexer control circuit comprises a first fuse set corresponding to the first sub memory cell array, a second fuse set corresponding to the second sub memory cell array and a third fuse set corresponding to the third sub memory cell array.

10. A stacked memory device, comprising:
a plurality of memory dies; and
a buffer die that controls the plurality of memory dies, wherein at least one of the memory dies comprises:
a first through silicon via (TSV) area including TSVs connected to the buffer die;
a memory cell array including a plurality of first sub memory cell arrays and a second sub memory cell array;
a multiplexing circuit that connects the plurality of first sub memory cell arrays and the second sub memory cell array to the first TSV area in a first mode for data input/output (I/O) operations from/to an external device, and in a second mode, the multiplexing circuit connects the plurality of first sub memory cell arrays and the second sub memory cell array, except for at least one failed cell array among the plurality of first sub memory cell arrays, to the first TSV area, wherein in the second mode the second sub memory cell array is used for repair of failed cells in the at least one failed cell array; and
a control logic circuit that selects the first mode or the second mode, controls the multiplexing circuit so that the plurality of first sub memory cell arrays is connected to first input or output pads, and controls the second sub memory cell array so that the second sub memory cell array is connected to the first input or output pads.

11. The stacked memory device of claim 10, wherein the buffer die comprises:
a second TSV area including TSVs connected to the plurality of memory dies; and second input or output pads connected to the second TSV area.

12. The stacked memory device of claim 10, wherein the control logic circuit comprises:
- a mode set circuit that sets the first mode or the second mode; and
- a multiplexer control circuit that controls the multiplexing circuit based on the set mode.

13. The stacked memory device of claim 12, wherein the control logic circuit further comprises a multiplexer that, in response to the set mode, connects the second sub memory cell array to the first input or output pads in the first mode or cuts the second sub memory cell array off from the first input or output pads in the second mode.

14. The stacked memory device of claim 12, wherein the mode set circuit comprises a fuse set for setting the first mode or the second mode.

15. The stacked memory device of claim 12, wherein the multiplexer control circuit comprises a fuse set corresponding to each of the plurality of first sub memory cell arrays.

16. A memory device, comprising:
- a memory cell array including a first sub memory cell array, a second sub memory cell array and a third sub memory cell array;
- a multiplexing circuit that selects the first, second and third sub memory cell arrays in a first operating mode for data input/output operations from/to an external device, and when the second sub memory cell array is defective in a second operating mode, deselects the second sub memory cell array, and selects the first and the third sub memory cell arrays, wherein in the second mode operation, the third sub memory cell array is used for repair of the second sub memory cell array; and
- a control logic circuit that selects the first operating mode or the second operating mode, wherein the control logic circuit controls the multiplexing circuit so that the first and the second sub memory cell arrays are connected to input or output pads, wherein the control logic circuit controls the third sub memory cell array so that the third sub memory cell array is connected to the input or output pads.

17. The memory device of claim 16, wherein the first and second sub memory cell arrays are disposed on a first memory die and the third sub memory cell array is disposed on a second memory die, the first and second memory dies being in a stacked configuration.

18. The memory device of claim 17, wherein in the second operating mode, when the first sub memory cell array is defective, data is written into the second or third sub memory cell arrays and a connection to the first sub memory cell array is physically cut.

19. The memory device of claim 17, wherein in the second operating mode, when the second sub memory cell array is defective, data is written into the first or third sub memory cell arrays and a connection to the second sub memory cell array is physically cut.

20. The memory device of claim 17, wherein the control logic circuit includes an operating mode set circuit for setting the first operating mode or the second operating mode by cutting fuses or in response to a mode register set (MRS) command.

* * * * *